US012730942B2

(12) United States Patent
Weiss

(10) Patent No.: US 12,730,942 B2
(45) Date of Patent: Sep. 8, 2026

(54) APPARATUS AND METHODS FOR FACILITATING A MULTI-MODEL HOME DESIGN

(71) Applicant: BHN Holding LLC, West Palm Beach, FL (US)

(72) Inventor: Joel Weiss, West Palm Beach, FL (US)

(73) Assignee: BHN Holding LLC, West Palm Beach, FL (US)

( * ) Notice: Subject to any disclaimer, the term of this patent is extended or adjusted under 35 U.S.C. 154(b) by 0 days.

(21) Appl. No.: 18/585,115

(22) Filed: Feb. 23, 2024

(65) Prior Publication Data

US 2025/0272444 A1 Aug. 28, 2025

(51) Int. Cl.
*G06F 30/13* (2020.01)
*G06F 30/27* (2020.01)

(52) U.S. Cl.
CPC .............. *G06F 30/13* (2020.01); *G06F 30/27* (2020.01)

(58) Field of Classification Search
CPC ................................. G06F 30/13; G06F 30/27
See application file for complete search history.

(56) References Cited

U.S. PATENT DOCUMENTS 11,263,363 B2 3/2022 Gifford
2019/0188338 A1 6/2019 Srivastava
2022/0318441 A1* 10/2022 Jagannathan .......... G06V 10/60

OTHER PUBLICATIONS

Rane, N., Choudhary, S., & Rane, J. (2023). Integrating Building Information Modelling (BIM) with ChatGPT, Bard, and similar generative artificial intelligence in the architecture, engineering, and construction industry (Nov. 22, 2023). (Year: 2023).*
Tanasra (Tanasra, H., Rott Shaham, T., Michaeli, T., Austern, G., & Barath, S. (2023). Automation in interior space planning: Utilizing conditional generative adversarial network models to create furniture layouts. Buildings, 13(7), 1793.) (Year: 2023).*

* cited by examiner

*Primary Examiner* — Bijan Mapar
(74) *Attorney, Agent, or Firm* — CALDWELL LLC

(57) ABSTRACT

An apparatus for facilitating a multi-model home design, the apparatus comprising a processor and a memory containing instructions configuring the processor to receive a spatial configuration schema containing compartment data files, communicate with a facilitator model by selecting the facilitator model from a plurality of facilitator models based on the compartment data files and generating a plurality of action datums associated with the compartment data files at the facilitator model, determine a provider model using the facilitator model as a function of the plurality of action datums, and execute the spatial configuration schema by initiating the plurality of action datums using the provider model.

14 Claims, 7 Drawing Sheets

APPARATUS AND METHODS FOR FACILITATING A MULTI-MODEL HOME DESIGN

FIELD OF THE INVENTION

The present invention generally relates to the field of multi-model data communication. In particular, the present invention is directed to apparatus and methods for facilitating a multi-model home design.

BACKGROUND

Current systems for implementing spatial configurations face the challenge of efficiently integrating user preferences, facilitator expertise, and provider capabilities to achieve a cohesive design outcome, and dynamically adjusting the design process based on real-time feedback and constraints to eliminating misalignments between user visions and final implementations.

SUMMARY OF THE DISCLOSURE

In an aspect, an apparatus for facilitating a multi-model home design is described. The apparatus includes at least a processor and a memory communicatively connected to the at least a processor, wherein the memory contains instructions configuring the at least a processor to receive a spatial configuration schema, wherein the spatial configuration schema includes a plurality of compartment data files, communicate with at least one facilitator model, wherein communicating with the at least one facilitator model includes selecting the at least one facilitator model from a plurality of facilitator models based on the plurality of compartment data files and generating a plurality of action datums associated with the plurality of compartment data files at the at least one facilitator model. The process is further configured to determine at least one provider model using the at least one facilitator model as a function of the plurality of action datums and execute the spatial configuration schema by initiating the plurality of action datums using the at least one provider model.

In another aspect, a method for facilitating a multi-model home design is described. The method includes receiving, by at least a processor, a spatial configuration schema, wherein the spatial configuration schema includes a plurality of compartment data files, communicating, by the at least a processor, with at least one facilitator model, wherein communicating with the at least one facilitator model includes selecting the at least one facilitator model from a plurality of facilitator models based on the plurality of compartment data files and generating a plurality of action datums associated with the plurality of compartment data files at the at least one facilitator model The method further includes determining, by the at least a processor, at least one provider model using the at least one facilitator model as a function of the plurality of action datums and executing, by the at least a processor, the spatial configuration schema by initiating the plurality of action datums using the at least one provider model.

These and other aspects and features of non-limiting embodiments of the present invention will become apparent to those skilled in the art upon review of the following description of specific non-limiting embodiments of the invention in conjunction with the accompanying drawings.

BRIEF DESCRIPTION OF THE DRAWINGS

For the purpose of illustrating the invention, the drawings show aspects of one or more embodiments of the invention. However, it should be understood that the present invention is not limited to the precise arrangements and instrumentalities shown in the drawings, wherein.

The drawings are not necessarily to scale and may be illustrated by phantom lines, diagrammatic representations and fragmentary views. In certain instances, details that are not necessary for an understanding of the embodiments or that render other details difficult to perceive may have been omitted.

DETAILED DESCRIPTION

At a high level, aspects of the present disclosure are directed to systems and methods for facilitating a multi-model home design. In an embodiment, apparatus employs a combination of user, facilitator, and provider models to streamline the design, coordination, and execution phases of a home design project.

Aspects of the present disclosure can be used to efficiently match user requirements with suitable facilitators and providers, ensuring that the end design aligns with the user's vision. Aspects of the present disclosure can also be used to dynamically adjust the design and execution process based on real-time feedback and constraints. This is so, at least in part, because the apparatus leverages one or more machine learning algorithms throughout the design lifecycle. Exemplary embodiments illustrating aspects of the present disclosure are described below in the context of several specific examples.

Figure 1:
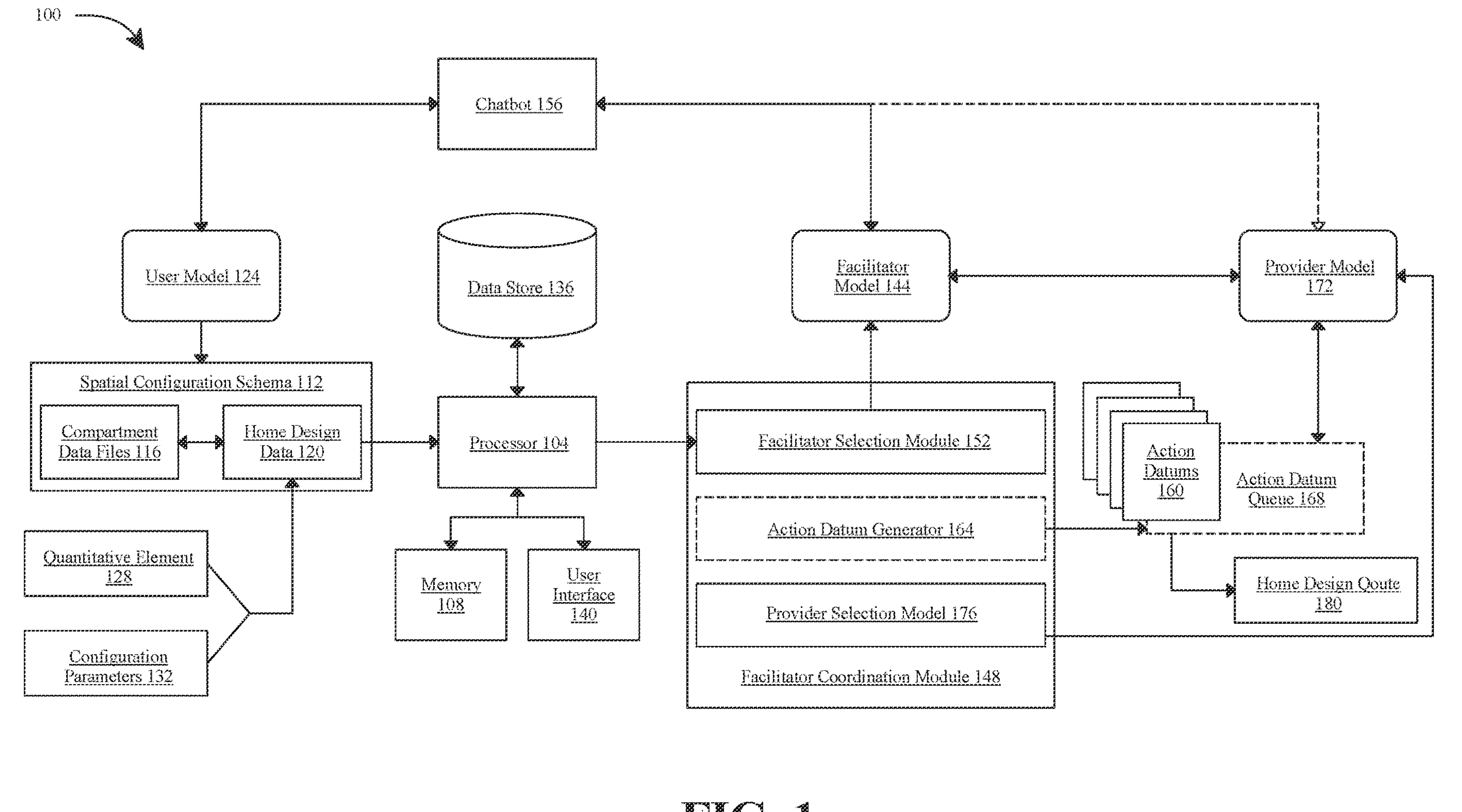
FIG. 1 is a block diagram of an exemplary embodiment of an apparatus for facilitating a multi-model home design.

Referring now to FIG. 1, an exemplary embodiment of an apparatus 100 for facilitating a multi-model home design is illustrated. Apparatus 100 includes a processor 104. Processor 104 may include any computing device as described in this disclosure, including without limitation a microcontroller, microprocessor, digital signal processor (DSP) and/or system on a chip (SoC) as described in this disclosure. Computing device may include, be included in, and/or communicate with a mobile device such as a mobile telephone or smartphone. Processor 104 may include a single computing device operating independently, or may include two or more computing device operating in concert, in parallel, sequentially or the like; two or more computing devices may be included together in a single computing device or in two or more computing devices. Processor 104 may interface or communicate with one or more additional devices as described below in further detail through a network interface device. Network interface device may be utilized for connecting processor 104 to one or more of a variety of networks, and one or more devices. Examples of a network interface device include, but are not limited to, a network interface card (e.g., a mobile network interface card, a LAN card), a modem, and any combination thereof. Examples of a network include, but are not limited to, a wide area network (e.g., the Internet, an enterprise network), a local area network (e.g., a network associated with an office, a building, a campus or other relatively small geographic space), a telephone network, a data network associated with a telephone/voice provider (e.g., a mobile communications provider data and/or voice network), a direct connection between two computing devices, and any combinations thereof. A network may employ a wired and/or a wireless mode of communication. In general, any network topology may be used. Information (e.g., data, software etc.) may be communicated to and/or from a computer and/or a computing device. Processor 104 may include but is not limited to, for example, a computing device or cluster of computing devices in a first location and a second computing device or cluster of computing devices in a second location. Processor 104 may include one or more computing devices dedicated to data storage, security, distribution of traffic for load balancing, and the like. Processor 104 may distribute one or more computing tasks as described below across a plurality of computing devices of computing device, which may operate in parallel, in series, redundantly, or in any other manner used for distribution of tasks or memory between computing devices. Processor 104 may be implemented using a "shared nothing" architecture in which data is cached at the worker, in an embodiment, this may enable scalability of system 100 and/or computing device.

With continued reference to FIG. 1, processor 104 may be designed and/or configured to perform any method, method step, or sequence of method steps in any embodiment described in this disclosure, in any order and with any degree of repetition. For instance, processor 104 may be configured to perform a single step or sequence repeatedly until a desired or commanded outcome is achieved; repetition of a step or a sequence of steps may be performed iteratively and/or recursively using outputs of previous repetitions as inputs to subsequent repetitions, aggregating inputs and/or outputs of repetitions to produce an aggregate result, reduction or decrement of one or more variables such as global variables, and/or division of a larger processing task into a set of iteratively addressed smaller processing tasks. Processor 104 may perform any step or sequence of steps as described in this disclosure in parallel, such as simultaneously and/or substantially simultaneously performing a step two or more times using two or more parallel threads, processor cores, or the like; division of tasks between parallel threads and/or processes may be performed according to any protocol suitable for division of tasks between iterations. Persons skilled in the art, upon reviewing the entirety of this disclosure, will be aware of various ways in which steps, sequences of steps, processing tasks, and/or data may be subdivided, shared, or otherwise dealt with using iteration, recursion, and/or parallel processing.

With continued reference to FIG. 1, apparatus 100 includes a memory 108 communicatively connected to processor 104, wherein the memory contains instructions configuring processor 104 to perform any processing steps and combinations thereof as described in this disclosure. As used herein, "communicatively connected" means connected by way of a connection, attachment, or linkage between two or more relata which allows for reception and/or transmittance of information therebetween. For example, and without limitation, this connection may be wired or wireless, direct, or indirect, and between two or more components, circuits, devices, systems, and the like, which allows for reception and/or transmittance of data and/or signal(s) therebetween. Data and/or signals therebetween may include, without limitation, electrical, electromagnetic, magnetic, video, audio, radio, and microwave data and/or signals, combinations thereof, and the like, among others. A communicative connection may be achieved, for example and without limitation, through wired or wireless electronic, digital, or analog, communication, either directly or by way of one or more intervening devices or components. Further, communicative connection may include electrically coupling or connecting at least an output of one device, component, or circuit to at least an input of another device, component, or circuit. For example, and without limitation, using a bus or other facility for intercommunication between elements of a processor 104. Communicative connecting may also include indirect connections via, for example and without limitation, wireless connection, radio communication, low power wide area network, optical communication, magnetic, capacitive, or optical coupling, and the like. In some instances, the terminology "communicatively coupled" may be used in place of communicatively connected in this disclosure.

With continued reference to FIG. 1, processor 104 may perform determinations, classification, and/or analysis steps, methods, processes, or the like as described in this disclosure using machine-learning processes. A "machine-learning process," as used in this disclosure, is a process that automatedly uses a body of data known as "training data" and/or a "training set" (described further below in this disclosure) to generate an algorithm that will be performed by a Processor module to produce outputs given data provided as inputs; this is in contrast to a non-machine learning software program where the commands to be executed are determined in advance by a user and written in a programming language. A machine-learning process may utilize supervised, unsupervised, lazy-learning processes and/or neural networks, described further below.

With continued reference to FIG. 1, processor 104 is configured to receive a spatial configuration schema 112. As used in this disclosure, a "spatial configuration schema (SCS)" is a structured digital representation that defines one or more arrangements, organizations, and/or interrelationships of spaces within a specific environment. In an embodiment, SCS 112 may be used for planning, designing, and/or executing projects in home and building design. In some cases, SCS 112 may encapsulate essential details about a plurality of spatial elements, their properties, and how the plurality of spatial elements interact with each other as described in detail below.

With continued reference to FIG. 1, SCS 112 includes a plurality of compartment data files 116. For the purpose of this disclosure, each "compartment data file" of the plurality of compartment data files 116 refers to a collection of detailed information, specifications, and/or attributes related to a specific spatial unit or section within a larger environment or structure. In an embodiment, compartment data files may serve as a modular component in SCS that encapsulate data pertinent to a particular compartment.

Still referring to FIG. 1, A "compartment," as described herein, is a section of a structure or a separate structure in which items can be placed. For example, compartment may include a dresser, a cabinet, a box, a storage unit, a sink, a bathtub, a cabinet under a sink and the like.

Still referring to FIG. 1, in an embodiment, each compartment data file may include a plurality of compartment configurations, wherein the "compartment configurations," for the purposes of this disclosure, refers to the modification or creation of a compartment. Compartment configuration may include selecting materials, determining dimensions, determining shapes and the like as described in detail below.

With continued reference to FIG. 1, in some cases, SCS 112 may compose multiple compartment data files, each representing a distinct spatial unit or section. Each compartment data file may adhere to specific format and protocols for data representation in a consistent manner; for instance, and without limitation, plurality of compartment data files 116 may be compatible with various design tools and third-party systems/platforms. In a non-limiting example, plurality of compartment data files 116 may include digital and/or physical files including lists of materials and/or furniture and the like. In some cases, each compartment data file may additionally, or alternatively include a design file such as a 3D illustration/model or a plurality of sketches of a particular room of a house.

Still referring to FIG. 1, in some cases, SCS 112 may include home design data 120 associated with plurality of compartment data files 116 received from a user model 124. As used in this disclosure, "home design data" is information related to design, layout, and/or features of a residential space. In an embodiment, home design data 120 may include both architectural and interior design elements, providing a holistic view of the home's structure, aesthetics, functionality, and spatial organization. In a non-limiting example, home design data 120 associated with each compartment data file may include one or more datasets for creating, modifying, and/or understanding each compartment within the residential space, capturing the essence of a home's design, from a structural blueprint to a plurality of interior décor choices, thereby ensuring that every aspect of the home is well-documented and accessible for various purpose (e.g., construction, renovation, visualization, etc.,) and models such as, without limitation, user model 124, facilitator model, and/or provider model as described herein.

Still referring to FIG. 1, exemplary embodiments of home design data 120 may include, without limitation, architectural data (i.e., blueprints, floor plans, elevations, cross-sections, and other architectural drawings that detail the home's structural design, dimensions, and/or layout), interior design data (i.e., information related to the aesthetics and functionality of the home's interior spaces, such as color schemes, furniture layouts, lighting plans, and/or décor choices), material specifications (i.e., data on the materials used in the construction and decoration of the home, including their types, qualities, finishes, and/or sources), spatial configuration (i.e., information about the organization and arrangement of different rooms and spaces within the home, including their purposes, relationships, and/or flow), utility and infrastructure data (i.e., details about the home's electrical, plumbing, heating, ventilation, air conditioning [HVAC] systems, and/or the like including their designs, capacities, and locations), landscape design data (i.e., information related to the design and layout of outdoor spaces, gardens, patios, and any other exterior features of the home), 3D models and visualizations (i.e., digital representations of the home, often used for virtual tours, simulations, or design iterations), budget and cost data (i.e., financial information related to the home's design, construction, decoration, and/or the like, including estimates, actual costs, and vendor details), among others. As an ordinary person skilled in the art, upon reviewing the entirety of this disclosure, will be aware of various home design data 120, SCS 112, and/or compartment data files 116 thereof may incorporate, thereby providing relevant stakeholders with comprehensive and systematic framework for planning, designing, and/or executing projects as described herein.

With continued reference to FIG. 1, in a non-limiting example, home design data 120 may include particular characteristics of a compartment and elements thereof that may be modified. Home design data 120 may include information relating to positioning of a hinge on a cabinet, a determination of a flushed side and n exposed side of a cabinet, and/or the like. In some cases, home design data 120 may include modifications to the dimensions of the compartment and elements thereof. In some cases, home design data 120 may include modifications to a particular compartment such as changes to the content of at least a portion of one or more sections of the particular compartment. In some cases, home design data 120 may include a particular number of user-selected furniture. For example, home design data 120 may indicate an interest of one or more end users in several furniture. Home design data 120 may include a selection and quantity of one of more interesting furniture.

With continued reference to FIG. 1, home design data 120 may be received from a user model 124. As used in this disclosure, a "user model" is a digital representation that encapsulates data related to an end user. In an embodiment user model 124 may include a user profile containing, without limitation, user preferences, user behaviors, user interactions, user input/output and/or the like of an individual end user. An "end user," for the purposes of this disclosure, is a recipient of data generated by processor 104 or otherwise an originator of data received by processor 104. In a non-limiting example, end user may include an individual who may benefit from data generated by processor 104. In some cases, end user may include, without limitation, a customer, a manufacturer, an employee within the same entity and/or the like. In other cases, end user may include an individual who may benefit from communication with one or more models as described herein.

Still referring to FIG. 1, in some cases, user model 124 may be associated with user data. Home design data 120 may also include user data. As used in this disclosure, "user data" is information associated with and user interacting with apparatus 100 as described herein. In some cases, user data may include personal information such as, without limitation, name, address, Tax identification number, phone numbers, associated entity's (e.g., name, address, and such of the company the user is working for) and the like. In some cases, user data may also include financial information (e.g., credit card numbers, debit card numbers, routing numbers for a bank account and/or any other information that may be used to transfer money from one individual or entity to another). In some cases, user data 120 may include information related to an entity, wherein the "Entity," for the purpose of this disclosure, is an organization comprised of a group of persons with a specific purpose. An entity may include a corporation, organization, business, group one or more persons, and the like. In some cases, user data may include identifying information about entity such as a name, address, phone number, email address, and the like. In some cases, user data may include information about an individual and their association with an entity. This may include, but is not limited to, the individuals' employment status, the individual's employment position, the individual's authority.

With continued reference to FIG. 1, home design data 120 may be received from one or more end users through one or more user inputs. Apparatus 100 may implement a digital environment incorporating various interactive tools such as, without limitation, design templates, virtual room planners, color pickers, furniture placement simulators, and/or the like. As end users interact with one or more tools within the digital environment, their choices, i.e., home design data 120 may be captured and/or recorded. A "digital environment," for the purpose of this disclosure, is an integrated communications environment where digital devices communicate and manage data and interactions within the digital environment. Digital device may be any electronic device as described in this disclosure that uses a digital signal instead of an analog signal for processing and transmitting data such as, without limitation, processor 104, user device, remote device, any computing device, and/or the like.

In a non-limiting example, and still referring to FIG. 1, SCS 112 and compartment data files 116, including associated home design data 120 may be received from a user device communicatively connected to processor 104. As used in this disclosure, a "user device" is any additional computing device used by end user to access and/or interact with processor 104. In some cases, user device may include, without limitation, user's smart phone, tablet, laptop, desktop and/or the like. SCS 112 may be received by processor 104 through various communication protocols; for instance, and without limitation, Apparatus 100 and user devise may be connected through digital environment such as a network (e.g., a computer network containing one or more data connections between one or more network nodes). In some cases, network may include, without limitation, personal area network (PAN), local area network (LAN), mobile ad hoc network (MANET), metropolitan area network (MAN), wide area network (WAN), cellular network, global area network (GAN), space network, and the like. Communication protocol may include, without limitation, internet protocol (IP), transmission control protocol (TCP), inter-access point protocol, address resolution protocol (ARP), dynamic host configuration protocol (DHCP), file transfer protocol (FTP), internet control message protocol (ICMP), and the like thereof.

With continued reference to FIG. 1, in some cases, compartment data file 116 may be generated by processor 104 at user model 124 as a function of the home design data 120 and/or user data as described above. In an embodiment, home design data 120 may include a quantitative element 128 associated with a plurality of configuration parameters 132. As used in this disclosure, a "quantitative element" refers to a specific, measurable component or attribute that can be quantified in terms of numbers, dimensions, quantities, or other numerical values. In some cases, quantitative element 128 may represent a concrete and objective measure related to a particular aspect of the home design; for instance, and without limitation, a plurality of elements contributes to the overall aesthetics, functionality, and/or layout of a space that are quantitative (e.g., color preferences, design styles, pricing, and/or the like that can be quantified). In a non-limiting example, quantitative element 128 may include a user-selected piece of furniture, wherein the associated measurable attributes, refers to as "configuration parameters" may include dimensions (e.g., height, width, depth, and overall size of the furniture piece), weight, capacity, quantity, material composition, cost, positional coordinates, among others.

Still referring to FIG. 1, exemplary embodiments of quantitative element 128 may include, without limitation, raised panel, recessed panel, recessed shaker, arched recessed panel, arched raised panel, slab, beaded kitchen cabinet, shaker kitchen cabinet, base kitchen cabinets, wall cabinets, and/or the like. Plurality of configuration parameters 132 associated with quantitative element listed above may include, without limitation, color configuration (e.g., shale, latte, sable, caramel, café, white, black, pink, grey, yellow, pastel, and the like), one or more type configurations (e.g., in-kitchen, in-bathroom, in-bedroom dresser, two-doors, sliding-door, single-door, hinged-door, overlaying, partial overlaying, inserting, and/or the like). As an ordinary person skilled in the art, upon reviewing the entirety of this disclosure, will be aware of various quantitative elements and configuration parameters associated with various quantitative elements may be provided by apparatus 100 for creating, modifying, and/or optimizing data compartment files and/or SCS as described in detail below.

Still referring to FIG. 1, each compartment data file may serve as a structured repository of such home design data containing spatial configurations, furniture selections, color schemes, and/or the like determined by one or more end users for a particular compartment. Plurality of compartment data files 116 may be generated, by processor 104, through one or more data integrations steps such as, without limitation, data identification, data extraction, data transformation, data mapping, data consolidation, validation, and/or the like, wherein generating compartment data file 116 may further include accessing user data (e.g., past design preferences, interaction history with digital environment and design platform/tools thereof, feedbacks on previous designs, personal preferences, and/or the like). In some cases, one or more machine learning models as described in detail below may be used to generate compartment data file 116. Additionally, or alternatively, SCS 112 may be further generated by combining plurality of compartment data files 116, for example, and without limitation, one or more aggregation algorithms (e.g., weighted averaging, data fusion, hierarchical clustering, principal component analysis, and/or the like) that harmonize and/or integrate data from plurality of compartment data files 116 may be utilized by processor 104 to create a cohesive and comprehensive design blueprint (i.e., SCS 112) that reflects the collective preferences and inputs from one or more end users.

With continued reference to FIG. 1, in a non-limiting example, plurality of compartment data files 116 may include one or more invoices indicating a compartment, its sizes, its modifications, and any add-ons. In some cases, each compartment data file of plurality of compartment data files 116 may include a temporal element, wherein the "temporal element," as described herein, refers to information indicating the amount of time it may take to manufacture the compartments mentioned within each compartment data file. In some cases, each configuration parameter of plurality of configuration parameters 132 and/or each quantitative element 128 may be associated with a temporal element. In an embodiment, a summation of all temporal elements (i.e., an overall time for the compartments to be delivered) may be incorporated by each compartment data file of plurality of compartment data files 116. Additionally, or alternatively, SCS 112 may include an associated temporal element wherein the summation of all the temporal elements may indicate the total time it may take for all quantitative elements 128 within every compartment data file to be ready, according to plurality of configuration parameters 132. Further, temporal elements may be associated with user model 124, wherein end user may assign one or more temporal elements with each quantitative elements in each compartment data file of plurality of compartment data files 116.

Still referring to FIG. 1, in some cases, processor 104 may be configured to receive one or more temporal elements as described above form a lookup table, wherein the lookup table may be retrieved from a database as described in detail below. In some cases, generating plurality of compartment data files 116 and/or associated SCS 112 may include combining data elements within user data and plurality of configuration parameters 132. In an embodiment, one or more compartment data files of plurality of compartment data files 116 may include user data such as the address of a user, a logo associated with the user, financial information associated with the user and/or the like. In other cases, plurality of compartment data files 116 may be available and/or accessible to other models as described below, for example, and without limitation, compartment data files may further include information relating to a dealer, a manufacturer, a worker, and/or the like. In such embodiment, plurality of compartment data files 116 may include a projected manufacturing date. In some cases, plurality of compartment data files 116 may include one or more configuration parameters 132 and associated quantitative element 128 as described above. In a non-limiting example, a particular set of dimensions or a particular color may be associated with a quantitative element 128 (e.g., a cabinet) may correspond to a quantitative indicator such as a number indicating a price deviation.

With continued reference to FIG. 1, in a non-limiting example, compartment data files may include any compartment data files as described in U.S. patent Ser. No. 18/389,350, filed on Nov. 14, 2023, and entitled, "COMPARTMENT CONFIGURATION INTERFACE MODULE AND A METHOD OF USE THEREOF," the entirety of which is incorporated herein by reference. As an ordinary person skilled in the art, upon reviewing the entirety of this disclosure, will be aware of various data, tools, or techniques that may be employed by apparatus 100 to generate SCS 112 and/or associated plurality of compartment data files 116 in consistent with the current disclosure.

With continued reference to FIG. 1, exemplary embodiments of SCS 112 as described herein may include home design SCS (i.e., residential projects that focuses on designing spaces within a home, such as living rooms, bedrooms, kitchens, bathrooms, and/or the like), home renovation SCS, office layout SCS (i.e., designed for commercial spaces including workstations, meeting rooms, recreational areas, and other office-specific spatial elements), or even urban planning SCS (i.e., an SCS on a larger scale which deals with urban design and city planning, considering roads, buildings, parks, and other urban infrastructure). In a non-limiting example, processor 104 may receive an SCS for a bathroom renovation project that may include compartment data files for shower area, sink, toilet, and flooring, wherein each compartment data file may specify the dimensions, materials, fixtures, and color schemes.

With continued reference to FIG. 1, SCS 112, associated compartment data files 116 and home design data 120 thereof, including user data, quantitative element 128, and configuration parameters 132, and/or any other data as described herein, may be received from a data store 136. In an embodiment, data store 136 may include a database. Data store 136 may be implemented, without limitation, as a relational database, a key-value retrieval database such as a NOSQL database, or any other format or structure for use as database that a person skilled in the art would recognize as suitable upon review of the entirety of this disclosure. Data store 136 may alternatively or additionally be implemented using a distributed data storage protocol and/or data structure, such as a distributed hash table or the like. Data store 136 may include a plurality of data entries and/or records as described above. Data entries in data store 136 may be flagged with or linked to one or more additional elements of information, which may be reflected in data entry cells and/or in linked tables such as tables related by one or more indices in a relational database. Persons skilled in the art, upon reviewing the entirety of this disclosure, will be aware of various ways in which data entries in data store 136 may store, retrieve, organize, and/or reflect data and/or records.

Still referring to FIG. 1, in other cases, data described herein such as SCS 112, plurality of compartment data files 116, user data, and/or the like may be received from user device through a user interface 140. For the purposes of this disclosure, a "user interface" is a means by which an end user and a computer system interact. For example, and without limitation, an individual may interact with apparatus 100 through the use of user device such as one or more input devices and/or remote devices through a software, wherein user interface 140 may be configured to facilitate the interaction between the user and processor 104 and digital environment as described herein. Exemplary embodiments of user interface 140 may include a graphical user interface (GUI), a command line interface (CLI), a menu-driven user interface, a touch user interface, a voice user interface (VUI), form-based user interface, any combination thereof and the like.

In a non-limiting example, and still referring to FIG. 1, a smart phone, smart tablet, or laptop operated by an end user and/or participant such as, without limitation, a house owner, may be used to upload and/or submit SCS 112, plurality of compartment data files 116, home design data 120, user data, selection of quantitative elements, associated configuration parameters, and/or the like of a house or a particular room of the house through user interface 140 displayed, wherein user interface 140 may include one or more graphical locator and/or cursor facilities allowing end user to interact with graphical models and/or combinations thereof, for instance using a touchscreen, touchpad, mouse, keyboard, and/or other manual data entry device. In some embodiments, user interface 140 such as a GUI may include one or more icons, menus, other visual indicators, or representations (graphics), audio indicators such as primary notation, and display information and related user controls. A menu may contain a list of choices and may allow users to select one from them. A menu bar may be displayed horizontally across the screen such as pull-down menu. When any option is clicked in this menu, then the pull-down menu may appear. A menu may include a context menu that appears only when the user performs a specific action. An example of this is pressing the right mouse button. When this is done, a menu may appear under the cursor. Files, programs, web pages and the like may be represented using a small picture in a graphical user interface. Persons skilled in the art, upon reviewing the entirety of this disclosure, will be aware of various ways in which a graphical user interface and/or elements thereof may be implemented and/or used as described in this disclosure.

With continued reference to FIG. 1, processor 104 may be further configured to receive a unique identifier, wherein the unique identifier may be used to retrieve SCS 112, plurality of compartment data files 116, and/or any other data thereof described herein associated with such unique identifier. In some cases, a unique identifier may be associated with at least one user model as described above. In a non-limiting example, unique identifier such as a username or a user ID may be used to retrieve a customized SCS 112 and plurality of compartment data files 116 previously saved at a user model associated that username or the user ID. Processor 104 may be configured to 'lookup' data as described above on data store 136. A "lookup table", a data structure such as without limitation, an array of data that maps input values to output values, may be used for such purposes. In some cases, lookup table may be used to replace a runtime computation or a communication within digital environment with an indexing operation, such as an array indexing operation. In other cases, look-up table may be configured to pre-calculate and store data in static program storage, calculated as part of a program's initialization phase or even stored in hardware in application-specific platforms.

With continued reference to FIG. 1, processor 104 is configured to communicate with at least one facilitator model 144. As used in this disclosure, a "facilitator model" refers to a digital representation designed to mediate, coordinate, or streamline interactions between multiple models, each associated with a different entity, within digital environment of the system. In an embodiment, at least one facilitator model 144 may act as an intermediary between user model 124 and one or more provider model as described in detail below, ensuring efficient multi-tiered or multi-entity interactions e.g., communication, task delegation, and/or process optimization between these two models. In a non-limiting example, at least one facilitator model 144 may include a digital representation of a home dealer or intermediary that plays a pivotal role in coordinating and/or streamlining interactions between various stake holders such as customers, providers, and other entities.

Still referring to FIG. 1, facilitator model may include associated facilitator data. In some cases, at least one facilitator model 144 may be established based on facilitator data. As described in this disclosure, "facilitator data" is information related to a facilitator e.g., a home dealer. In some cases, facilitator data may include facilitator role, expertise, services, functions, and/or the like. In a non-limiting example, facilitator data associated with at least one facilitator model 144 may encapsulate home dealer's offerings, capabilities, past projects, customer feedback, and/or the like.

With continued reference to FIG. 1, in an embodiment, communicating with at least one facilitator model 144 may include communicating, using user model 124, received SCS 112 with at least one facilitator model 144 in digital environment. In some cases, such communication between two models, e.g., user model 124 and at least one facilitator model 144 may be enabled, by a facilitator coordination module 148. As used in this disclosure, a "facilitator coordination module" refers to a component or subsystem designed to manage, coordinate, and/or control the communication and interaction with at least one facilitator model 144. In an embodiment, facilitator coordination module 148 may be configured to receive data such as, without limitation, received SCS 112, plurality of compartment data files 116, home design data 120, user data, and/or the like and determine at least one facilitator model 144 user model 124 may communicate with.

Still referring to FIG. 1, in some cases, plurality of compartment data files 116 may include a plurality of compartment categorizations, each compartment data file of plurality of compartment data files 116 may be associated with one or more compartment categorizations. As used in this disclosure, a "compartment categorization" is a grouping of compartment data files based having similar attributes. For example, and without limitation, quantitative elements described within one or more compartment data files having similar color characteristics may have a similar compartment categorization. Exemplary embodiments of compartment categorizations may include, but is not limited to, a particular end user, a color schema, a particular style, a particular design, a particular quality (e.g. wood, steel, quartz etc.), a particular Grade (e.g. premium grade cabinets made of high quality materials, medium quality cabinets made of lower quality materials and the like), a particular designation (e.g. cabinets for the kitchen, cabinets for the bathroom, cabinets for the garage and the like), a particular add-on (e.g. cabinets containing a garbage disposal or having the capability thereof, cabinets capable of containing shelves, and the like).

Still referring to FIG. 1, determining at least one facilitator model 144 may include matching compartment categorizations with a plurality of facilitator data associated with a plurality of facilitator models available within digital environment and determining at least one facilitator model 144 from the plurality of facilitator models upon a successful match. In some cases, matching process may involve comparing specific attributes, requirements, or characteristics of compartment categorizations with capabilities, specialties, or offerings represented by plurality of facilitator data. In a non-limiting example, if a compartment categorization received from user model 124 indicates a preference for a modern kitchen design, processor 104 may search through plurality of facilitator models using one or more queries to identify at least one facilitator model 144 that satisfy such criterion i.e., specialize in modern kitchen designs (and potentially have a track record of handling similar dimensions and features). Once identified, at least one facilitator model 144 that (best) aligns with compartment categorization may be selected, ensuring that user model 124 is paired with the most suitable facilitator for the projects.

With continued reference to FIG. 1, plurality of facilitator models and associated facilitator data may be stored within data store 136. Facilitator coordination module 148 as described herein may be communicatively connected to data store 136. In some cases, data store 136 may include one or more database that are populated by one or more end users, wherein a user, e.g., customers may insert one or more preferred facilitators. Processor 104 may be configured to generate one or more facilitator models based on facilitator data. In a non-limiting example, if a user model has had a positive connection (i.e., positive experience) with a particular home design facilitator specializing in eco-friendly living spaces, the user model may input such facilitator's details into data store 136. When another user model expresses interest in eco-friendly designs, processor 104 may be configured to generate a facilitator model that prioritizes or recommends such particular facilitator based on stored user model input.

With continued reference to FIG. 1, in some cases, at least one facilitator model 144 may be selected using one or more machine learning models. In an embodiment, facilitator coordination module 148 may include a machine learning module to implement one or more algorithms or generate one or more machine-learning models, such as facilitator selection model 152, to determine at least one facilitator model 144 user model 124 may communicate with. However, the machine learning module is exemplary and may not be necessary to generate one or more machine learning models and perform any machine learning described herein. In one or more embodiments, one or more machine-learning models may be generated using training data. Training data may include inputs and corresponding predetermined outputs so that a machine-learning model may use correlations between the provided exemplary inputs and outputs to develop an algorithm and/or relationship that then allows machine-learning model to determine its own outputs for inputs. Training data may contain correlations that a machine-learning process may use to model relationships between two or more categories of data elements.

Still referring to FIG. 1, in some cases, exemplary inputs and outputs of training data may come from data store 136 as described above or be provided by a user. In other cases, machine-learning module of facilitator coordination module 148 may obtain a training set by querying a communicatively connected database that includes past inputs and outputs. Training data may include inputs from various types of databases, resources, and/or user inputs and outputs correlated to each of those inputs so that a machine-learning model may determine an output. Correlations may indicate causative and/or predictive links between data, which may be modeled as relationships, such as mathematical relationships, by machine-learning models, such as facilitator selection model 152 as described in further detail below. In one or more embodiments, training data may be formatted and/or organized by categories of data elements by, for example, associating data elements with one or more descriptors corresponding to categories of data elements. As a non-limiting example, training data may include data entered in standardized forms by persons or processes, such that entry of a given data element in a given field in a form may be mapped to one or more descriptors of categories. Elements in training data may be linked to categories by tags, tokens, or other data elements.

With continued reference to FIG. 1, in a non-limiting example, facilitator coordination module 148 may be configured to generate a facilitator selection model 152 using machine learning module as described above using training data, such as facilitator selection training data. Generating facilitator selection model 152 may include receiving facilitator selection training data and training facilitator selection model 152 by correlated inputs and outputs e.g., a plurality of compartment data files as input correlated to a plurality of facilitator models as output. In some case, facilitator selection training data may include one or more data sets that have already been converted from raw data whether manually, by machine, or any other method. Such facilitator selection training data may be stored and/or received from data store 136 as described above. In an embodiment, facilitator selection training data may further include a plurality of home design data including compartment categorizations as input correlated to a plurality of facilitator models as output. In such embodiment, facilitator selection model 152 may be trained to recognize and/or extract particular home design patterns and/or patterns within home design data, enabling facilitator coordination module 152 to determine one or more facilitator model 148 based on the specific home design patterns and/or preferences of user model 124. Processor 104 may then be configured to select at least one facilitator model 144 from plurality of facilitator models determined using the trained facilitator selection model 152.

With continued reference to FIG. 1, additionally, or alternatively, one or more chatbots 156 may be deployed within digital environment, communicatively connected with processor 104. As used in this disclosure, a "chatbot" is a software application designed to simulate human conversation, either through text or voice interactions, using a set of predefined rules, one or more machine learning algorithms, or a combination of both. In an embodiment, facilitator coordination module 148 may include at least a chatbot configured to communicate with user model 124 and/or at least one facilitator model 144. Chatbot 156 may be configured to establish a real-time communication between two or more models e.g., communication between user model 124 and at least one facilitator model 144. Chatbot 156 may act as a communication pathway between user model 124 and at least one facilitator model 144. In some cases, SCS 112 may be transmitted to facilitator model 144 as a form of user input, for example, and without limitation, as one or more text messages, voice commands, user queries, user feedback or responses. In some cases, facilitator model 144 may derive SCS 112 and plurality of compartment data files based on real-time or historical conversational data may be received using chatbot 156. Other exemplary data such as, without limitation, home design data 120 including selection of quantitative elements and corresponding configuration parameters, user data, facilitator data, and/or any other data as described herein may be communicated between user model 124 and at least one facilitator model 144.

Still referring to FIG. 1, chatbot 156 may be configured to proactively engage with user 116, prompting end user or facilitator with one or more questions, providing suggestions, or guiding end user or facilitator through specific tasks based on submitted/received SCS 112. Processor 104 may record the conversation between user model 124 and at least one facilitator model 144 in data store 136 as described above. It should be noted that, in other cases, user model 124 may directly transmit SCS 112, plurality of compartment data files 116, and/or any other relevant data thereof to at least one facilitator model 144 without usage of chatbot 156 as described herein. Chatbot 156 is described in detail below with reference to FIG. 3.

With continued reference to FIG. 1, in some cases, facilitator coordination module 148 may be configured to generate one or more chatbots 148 using a language processing module. In an embodiment, each chatbot may be configured to connect a plurality of user models to a plurality of facilitator models, for instance, and without limitation, at least one facilitator model 144 may be paired, by processor 104, with more than one user model. Language processing module may include any hardware and/or software module. Language processing module may be configured to extract, from the one or more documents, one or more words. One or more words may include, without limitation, strings of one or more characters, including without limitation any sequence or sequences of letters, numbers, punctuation, diacritic marks, engineering symbols, geometric dimensioning and tolerancing (GD&T) symbols, chemical symbols and formulas, spaces, whitespace, and other symbols, including any symbols usable as textual data as described above. Textual data may be parsed into tokens, which may include a simple word (sequence of letters separated by whitespace) or more generally a sequence of characters as described previously. The term "token," as used herein, refers to any smaller, individual groupings of text from a larger source of text; tokens may be broken up by word, pair of words, sentence, or other delimitation. These tokens may in turn be parsed in various ways. Textual data may be parsed into words or sequences of words, which may be considered words as well. Textual data may be parsed into "n-grams", where all sequences of n consecutive characters are considered. Any or all possible sequences of tokens or words may be stored as "chains", for example for use as a Markov chain or Hidden Markov Model.

Still referring to FIG. 1, language processing module may operate to produce a language processing model. Language processing model may include a program automatically generated by computing device and/or language processing module to produce associations between one or more words extracted from at least a document and detect associations, including without limitation mathematical associations, between such words. Associations between language elements, where language elements include for purposes herein extracted words, relationships of such categories to other such term may include, without limitation, mathematical associations, including without limitation statistical correlations between any language element and any other language element and/or language elements. Statistical correlations and/or mathematical associations may include probabilistic formulas or relationships indicating, for instance, a likelihood that a given extracted word indicates a given category of semantic meaning. As a further example, statistical correlations and/or mathematical associations may include probabilistic formulas or relationships indicating a positive and/or negative association between at least an extracted word and/or a given semantic meaning; positive or negative indication may include an indication that a given document is or is not indicating a category semantic meaning. Whether a phrase, sentence, word, or other textual element in a document or corpus of documents constitutes a positive or negative indicator may be determined, in an embodiment, by mathematical associations between detected words, comparisons to phrases and/or words indicating positive and/or negative indicators that are stored in memory at computing device, or the like.

Still referring to FIG. 1, language processing module and/or diagnostic engine may generate the language processing model by any suitable method, including without limitation a natural language processing classification algorithm; language processing model may include a natural language process classification model that enumerates and/or derives statistical relationships between input terms and output terms. Algorithm to generate language processing model may include a stochastic gradient descent algorithm, which may include a method that iteratively optimizes an objective function, such as an objective function representing a statistical estimation of relationships between terms, including relationships between input terms and output terms, in the form of a sum of relationships to be estimated. In an alternative or additional approach, sequential tokens may be modeled as chains, serving as the observations in a Hidden Markov Model (HMM). HMMs as used herein are statistical models with inference algorithms that that may be applied to the models. In such models, a hidden state to be estimated may include an association between an extracted words, phrases, and/or other semantic units. There may be a finite number of categories to which an extracted word may pertain; an HMM inference algorithm, such as the forward-backward algorithm or the Viterbi algorithm, may be used to estimate the most likely discrete state given a word or sequence of words. Language processing module may combine two or more approaches. For instance, and without limitation, machine-learning program may use a combination of Naive-Bayes (NB), Stochastic Gradient Descent (SGD), and parameter grid-searching classification techniques; the result may include a classification algorithm that returns ranked associations.

Continuing to refer to FIG. 1, generating language processing model may include generating a vector space, which may be a collection of vectors, defined as a set of mathematical objects that can be added together under an operation of addition following properties of associativity, commutativity, existence of an identity element, and existence of an inverse element for each vector, and can be multiplied by scalar values under an operation of scalar multiplication compatible with field multiplication, and that has an identity element is distributive with respect to vector addition, and is distributive with respect to field addition. Each vector in an n-dimensional vector space may be represented by an n-tuple of numerical values. Each unique extracted word and/or language element as described above may be represented by a vector of the vector space. In an embodiment, each unique extracted and/or other language element may be represented by a dimension of vector space; as a non-limiting example, each element of a vector may include a number representing an enumeration of co-occurrences of the word and/or language element represented by the vector with another word and/or language element. Vectors may be normalized, scaled according to relative frequencies of appearance and/or file sizes. In an embodiment associating language elements to one another as described above may include computing a degree of vector similarity between a vector representing each language element and a vector representing another language element; vector similarity may be measured according to any norm for proximity and/or similarity of two vectors, including without limitation cosine similarity, which measures the similarity of two vectors by evaluating the cosine of the angle between the vectors, which can be computed using a dot product of the two vectors divided by the lengths of the two vectors. Degree of similarity may include any other geometric measure of distance between vectors.

Still referring to FIG. 1, language processing module may use a corpus of documents to generate associations between language elements in a language processing module, and diagnostic engine may then use such associations to analyze words extracted from one or more documents and determine that the one or more documents indicate significance of a category. In an embodiment, language module and/or processor 104 may perform this analysis using a selected set of significant documents, such as documents identified by one or more experts as representing good information; experts may identify or enter such documents through graphical user interface, or may communicate identities of significant documents according to any other suitable method of electronic communication, or by providing such identity to other persons who may enter such identifications into processor 104. Documents may be entered into a computing device by being uploaded by an expert or other persons using, without limitation, file transfer protocol (FTP) or other suitable methods for transmission and/or upload of documents; alternatively or additionally, where a document is identified by a citation, a uniform resource identifier (URI), uniform resource locator (URL) or other datum permitting unambiguous identification of the document, diagnostic engine may automatically obtain the document using such an identifier, for instance by submitting a request to a database or compendium of documents such as JSTOR as provided by Ithaka Harbors, Inc. of New York.

With continued reference to FIG. 1, communicating with at least one facilitator model 144 includes generating a plurality of action datums 160 associated with plurality of compartment data files 116 at the at least one facilitator model 144. As described in this disclosure, each "action datum" of plurality of action datums 160 refers to a specific piece of actionable information or instruction derived from processing and/or interpretation of plurality of compartment data files 116. In some embodiments, plurality of action datums 160 may include a plurality of tangible step, task, or otherwise activities that needs to be undertaken based on provided compartment data files. In a non-limiting example, upon receiving plurality of compartment data files 116 through communication between user model 124 and at least one facilitator model 144, compartment data files may undergo a process of data analysis including extracting relevant information from the compartment data files, e.g., quantitative elements 128 and associated configuration parameters 132, and subsequently generating one or more specific action datums 160 that may each outline at least a tangible step or task to fulfill, or at least modify e.g., making a progress on, one or more objectives represented by the extracted data. In a non-limiting example, for a given compartment data file containing information about a user's preference for a minimalist living room design with specific color palettes, at least one facilitator model 144 may generate one or more action datums such as, without limitation, "source minimalist furniture," "procure paint in specified color," and/or "consult with minimalist design experts." In one or more embodiments, plurality of action datums may be generated for compartment and/or compartment data file 116. For example, and without limitation, a plurality of actions datums may be generated for a particular cabinet wherein the action datums may include designing the cabinet, manufacturing the cabinet, painting the cabinet, delivering the cabinet and the like. In another non limiting example, plurality of actions datums may be generated for a compartment such as a dishwasher wherein action datums may include hooking the dishwasher to a water line, providing the dishwasher with a power source and the like. In one or more embodiments, each action datum may be generated for each compartment data file 116 wherein action datums may be categorized by their respective compartment data files 116. In one or more embodiments, action datums 160 may be categorized based on the particular professional required to execute the action datum 160. For example, and without limitation, all actions datums 160 required to be executed by electricians may be placed within a first category whereas all action datums required to be executed by a delivery driver may be placed within a second category. In an aspect, provider models 172 (as described in further detail below) may be selected based on action datums 160 within each categorization, wherein an electrician may be selected in instances in which one or more action datum 160 may be placed within an electrician categorization. In some cases, plurality of action datums 160 may be displayed to end user through user interface 140 as described above.

Still referring to FIG. 1, in some cases, plurality of action datums 160 may be generated based on manual inputs by one or more end users or facilitators. In other cases, generating plurality of action datums 160 may include utilizing one or more machine learning models, such as, without limitation, action datums generator 164. In an embodiment, machine learning module within facilitator coordination module 148 may implement one or more aspects of "generative artificial intelligence (AI)," a type of AI that uses machine learning algorithms to create, establish, or otherwise generate data such as, without limitation, plurality of action datums 160 that is similar to one or more provided training examples. In an embodiment, machine learning module described herein may generate one or more generative machine learning models that are trained on one or more set of pre-defined action datum templates. One or more generative machine learning models may be configured to generate new examples that are similar to the training data of the one or more generative machine learning models but are not exact replicas; for instance, and without limitation, data quality or attributes of the generated examples may bear a resemblance to the training data provided to one or more generative machine learning models, wherein the resemblance may pertain to underlying patterns, features, or structures found within the provided training data.

Still referring to FIG. 1, in some cases, pre-defined action datum templates may include one or more templates such as, without limitation, one or more work order forms, invoices, contracts, and the like. In some cases, pre-defined action datum templates may also include example projects a potential user may be working on such as a project involving cabinets, a project involving dressers, a project involving painting a house and the like in a real-world setting. In other cases, pre-defined action datum template may further include specific design blueprints, material lists, cost estimations, user feedback forms, among others.

In a non-limiting example, and still referring to FIG. 1, action datum generator 164 may include one or more generative machine learning models. Generative machine learning models may include a generative adversarial network (GAN). As used in this disclosure, a "generative adversarial network" is a type of artificial neural network with at least two sub models (e.g., neural networks), a generator, and a discriminator, that compete against each other in a process that ultimately results in the generator learning to generate new data samples, wherein the "generator" is a component of the GAN that learns to create hypothetical data by incorporating feedbacks from the "discriminator" configured to distinguish real data from the hypothetical data. In some cases, generator may learn to make discriminator classify its output as real. In an embodiment, discriminator may include a supervised machine learning model while generator may include an unsupervised machine learning model as described in further detail with reference to FIG. 2.

With continued reference to FIG. 1, in an embodiment, discriminator may include one or more discriminative models, i.e., models of conditional probability $P(Y|X=x)$ of target variable Y, given observed variable X. In an embodiment, discriminative models may learn boundaries between classes or labels in given training data. In a non-limiting example, discriminator may include one or more classifiers as described in further detail below with reference to FIG. 2 to distinguish between different categories e.g., real vs. fake, or states e.g., TRUE vs. FALSE within the context of generated data such as, without limitations, plurality of action datums 160, and/or the like. In some cases, processor 104 may implement one or more classification algorithms as described below such as, without limitation, Support Vector Machines (SVM), Logistic Regression, Decision Trees, and/or the like to define decision boundaries.

Still referring to FIG. 1, in some embodiments, generator of GAN may be responsible for creating synthetic data that resembles real action datums. In some cases, GAN may be configured to receive compartment data files such as, without limitation, room dimensions, user preferences, material specifications, design themes, budget constraints, and/or the like as input and generates corresponding action datum containing specific tasks, timelines, resource allocations, and other relevant details tailored to input data listed above. On the other hand, discriminator of GAN may evaluate the authenticity of the generated content by comparing it to real action datums, for example, discriminator may distinguish between genuine and generated content and providing feedback to generator to improve the model performance.

With continued reference to FIG. 1, action datum generator may include other exemplary generative machine learning models such as, without limitation, variational autoencoder (VAE), long short-term memory networks (LSTMs), (generative pre-trained) transformer (GPT) models, mixture density networks (MDN) and/or the like. As an ordinary person skilled in the art, upon reviewing the entirety of this disclosure, will be aware of various generative machine learning models that may be used to generate plurality of action datums 160 as described herein.

With continued reference to FIG. 1, additionally, or alternatively, generating plurality of action datums may include initializing an action datum queue 168 and arranging plurality of action datums within the action datum queue 168 by prioritizing plurality of action datums based on temporal element associated with each action datum. Temporal element may include any temporal element as described above, such as, without limitation, a timestamp. As described in this disclosure, an "action datum queue" is a data structure that (temporarily) holds and manages plurality of action datums 160 before plurality of action datums 160 are processed or executed as described below. In an embodiment, action datum queue 168 may include a structured repository or buffer that systematically arrange, or sequence based on temporal element associated with each action datum, for example, and without limitation, plurality of temporal elements may provide a chronological context to plurality of action datums 160, indicating when associated action datum should be initiated, executed, or completed as described in detail below. In other cases, temporal element may further include multiple timestamps that delineate a range or span of time, marking a start, one or more intermediate checkpoints, and an end of an action or tasks.

Still referring to FIG. 1, in some cases, action datum queue 168 may be a dynamic data structure, for example, and without limitation, processor 104 may initialize action datum queue 168 using First-In-First-Out (FIFO) or Last-In-First-Out (LIFO) algorithms. In an embodiment, action datum queue 168 may be designed to ensure plurality of action datums 160 are processed in an order that aligns with their temporal elements. In a non-limiting example, if action datum queue 168 contain three action datums with timestamps indicating tasks to be executed at 10:00 AM, 10:30 AM, and 11:00 AM respectively, action datum queue 168 may ensure that the 10:00 AM task is processed first, followed by the 10:30 AM task, and finally the 11:00 AM task. In some cases, action datum queue 168 may include a priority queue, wherein each action datum within the queue may be assigned with a priority (e.g., low, medium, or heigh). Priority algorithms that weigh the importance or urgency of each action datum of plurality of action datums 160 may be incorporated by action datum queue 168. This means that even if an action datum has a later timestamp, it may be processed earlier if its priority level is deemed higher than other tasks in the queue.

Still referring to FIG. 1, in other cases, action datum queue 168 may be integrated with external systems or tools, such as calendar applications or project management software within digital environment. In a non-limiting example, processor 104 may be configured to create a schedule as a function of action datum queue, synchronized among all models in real-time within digital environment as described herein. In some cases, plurality of action datums 160 may be displayed by user interface 140 as a schedule view (e.g., in a calendar format). In such an embodiment, any changes or updates in other models or external systems may be immediately reflected in action datum queue 168.

With continued reference to FIG. 1, processor 104 is configured to determine at least one provider model 172 using at least one facilitator model 144 as a function of plurality of action datums 160. As described herein, a "provider model" refers to a digital representation of a service provider or entity that offers specific goods, services, or functionalities within a system or platform. Similar to user model 124 and at least one facilitator model 144, at least one provider model 172 may be associated with provider data (i.e., information related to the service provider) that encapsulates one or more characteristics, capabilities, and constraints of the provider. In should be noted that, in some cases, user model, facilitator model, and provider model may be distinct models within digital environment, each tailored to represent specific entity with data describing their unique attributes and functionalities; however, in other cases, a single model may be versatile to serve multiple user roles, for example, and without limitation, an individual may be represented as a user when seeking services, a facilitator when coordinating or mediating services, and a provider when offering services. Additionally, or alternatively, authenticity of an end user, whether the end user interacts as a user, facilitator, or provider, may be verified and/or validated using verification/validation mechanisms, such as digital signatures, two-factor authentication, or blockchain-based validation. Such verification/validation mechanisms may be integrated into apparatus 100 to ensure that the interactions and transactions are genuine, secure, and trustworthy.

With continued reference to FIG. 1, provider data associated with at least one provider model 172 may include a set of data points related to attributes that define the provider's characteristics. In some embodiments, provider data may include provider's specialization, location, availability, capacity, and performance metrics. In some cases, provider data may also outline the specific services or functionalities at least one provider model 172 may offer (range from tangible goods to intangible services or even computational tasks). In other cases, provider data may further include at least a data point describing an availability status (e.g., free, busy, on the way, off-site, and/or the like) of corresponding provider model. In some cases, facilitator coordination module 148 may be configured to select at least one provider model 172 from a provider model network based on plurality of action datums 160 as described above. Determining at least one provider model 172 may include matching each action datum of plurality of action datums 160 with provider data as described herein. In a non-limiting example, provider model network may include a plurality of provider models such as, without limitation, furniture suppliers, manufactures, interior designers, construction contractors, home inspectors, and/or the like. In one or more embodiments, each provider model 172 may be categorized to a particular provider categorization. "Provider categorization" for the purposes of this disclosure is a grouping of provider models based on the particular characteristics of each provider model. For example, and without limitation provider categorization may include categorizations such as the particular type of specialization (e.g. carpentry, electrician, plumbing and the like), the location, specific services (e.g. construction, design, and the like) and the like. In one or more embodiments, provider models 172 may be classified to one or more provider categorizations. In one or more embodiments, classification may be done using a machine learning model such as any machine learning model as described in this disclosure. In one or more embodiments, each provider model 172 may be classified to one or more provider categorizations wherein a provider model 172 may contain more than one characteristics that allows for multiple groupings. In one or more embodiments, actions datums 160 may be classified to provider categorizations wherein selecting a provider model 160 may include selecting a provider model 172 having similar provider categorizations as the action datums 160. In an embodiments, a provider model classified to a particular provider categorization may be selected in instances in which an action datum 160 is categorized and/or classified to the same categorization. In one or more embodiments, only provider models that are available on a specific data and/or available to provide services within a particular geographic location may be categorized and/or determined. For example, and without limitation, a provider model associated with a different state may not be selected in instances in which services require the provider to be physically present at a particular location. In one or more embodiments, multiple provider models 172 may be determined wherein a facilitator model 144 may select one or more of the determined provider models. In one or more embodiments, the facilitator model 144 may select a provider model 172 based on distance availability, specialty, categorization, and the like. In one or more embodiments, determining at least one provider model using the at least one facilitator model as a function of the plurality of action datums 160 may include determining more than one provider models 172 wherein facilitator model 144 may be configured to select at least one provider model of the more than one provider models 172.

With continued reference to FIG. 1, in an embodiment, determining the at least one provider model 172 may include scoring plurality of provider models at the at least one facilitator model 144 and selecting a highest scoring provider model. In some cases, scoring process may entail scoring plurality of provider models within provider model network at the at least one facilitator model 144 based on one or more predefined criteria associated with plurality of action datums 160. Each action datum of plurality of action datums 160 may be associated with different criteria. In a non-limiting example, scoring criteria may include a level of proficiency and/or experience of the provider in specific areas of home design (e.g., interior design, architecture, landscaping, or renovation), assessment of the provider's past projects, designs, and accomplishments (including, without limitation, reviewing photographs, client testimonials, and design complexity), provider availability, delivery timeframe, provider's service charges in relation to quality and scope of services offered, geographical proximity (i.e., providers located closer to the project site to facilitate easier coordination and reduce logistical challenges), compatibility with user model 124 (i.e., how well the provider's style, approach, and offerings align with the user preferences and requirements specified in the user model), among others.

Still referring to FIG. 1, in some cases, facilitator coordination module 148 may be configured to initiate one or more communication between at least one facilitator model 144 and at least one provider model 172 based on plurality of action datums generated as a function of plurality of compartment data files 116, using a chatbot as described above. Upon receiving a home design request (i.e., receipt of plurality of compartment data files 116), at least a facilitator model 144 may initiate a scoring process. In some cases, scoring process may be supervised by one or more machine learning models within facilitator coordination module 148. Each provider model within provider model network may be evaluated against the scoring criteria, and a cumulative score may be calculated and assigned, wherein provider model network may be retrieved from data store 136 as described above. In some cases, post-evaluation, plurality of provider models may be ranked, by at least a facilitator model 144, based on the scores, and a highest-scoring provider model may be selected as the most suitable candidate for current action datum. This scoring process may be iteratively performed at the at least one facilitator model 144 by processor 104, for each action datum within action datum queue 168 as described above.

In a non-limiting example, and still referring to FIG. 1, for a user seeking a modern minimalist interior design for their apartment, a provider specializing in contemporary designs with a portfolio showcasing similar projects may score higher. Similarly, if a user's home design request emphasizes eco-friendly and sustainable designs, a provider with expertise in green building practices and sustainable design principles may be ranked higher. In yet another non-limiting example, in cases where rapid project completion is a priority, providers with immediate availability and a track record of timely project delivery may receive higher scores.

With continued reference to FIG. 1, one or more machine learning models such as, without limitation, a provider selection model, may be generated by machine learning module within facilitator coordination module 148 as described above may be used to determining at least one provider model 172. Provider selection model 176 may be generated and trained using provider selection training data, wherein the provider training data may include a plurality of action datum sets as input correlated to a plurality of provider models as output. In a non-limiting example, each action datum set may include an action datum queue, which means that plurality of action datums within the set may be sequenced in a particular order as described above. In another non-limiting example, each action datum set may include plurality of action datums that are held by an array or list-like data structure that is not sorted by any means. Such provider selection training data may indicate one or more provider models and/or combinations thereof may be capable of executing one or more action datums as described herein. Processor 104 may then be configured to determine at least one provider model 172 as a function of plurality of action datums 160 using the trained provider selection model 176.

With continued reference to FIG. 1, further, machine learning models described herein, such as, without limitation, facilitator selection model 152, action datum generator 164, provider selection model 176, and/or the like may include a feedback mechanism, wherein one or more feedback loops may be incorporate into machine leaning models listed above, allowing apparatus 100 to receive performance data or user reviews (e.g., ratings) about facilitators and/or providers, which may be used for optimization and quality assurance (QA) of the machine learning module.

With continued reference to FIG. 1, processor 104 is configured to execute SCS 112 by initiating plurality of action datums 160 using at least one provider model 172. In a non-limiting example, each action datum of plurality of action datums 160 may be considered as a discrete task or an operation that needs to be performed, by at least one provider model 172 to realize a specific aspect of SCS 112. In some cases, these action datums may be derived by at least one facilitator model 144 from SCS 112 and represented as actionable steps that guide the transformation of a space in alignment with home design data 120 as described above. Processor 104 may leverage at least one provider model 172 to facilitate the execution plurality of action datums. In some cases, execution of plurality of action datums may include modular design execution; for instance, and without limitation, in a scenario where SCS 112 contains a modular kitchen design, individual action datums may pertain to the installation of cabinetry, placement of appliances, and integration of lighting fixtures. At least one facilitator model 144 may determine one or more provider models and processor 104 may delegate each of these tasks to at least one provider specializing in those areas. In some cases, at least one provider model 172 may be configured to execute more than one action datums. In other cases, each action datum of plurality of action datums may be executed by different provider model within the network.

Still referring to FIG. 1, in a non-limiting example, for a SCS that specifies a Scandinavian interior design theme, plurality of action datums 160 generated by at least one facilitator model 144 may include tasks such as, without limitation, "sourcing light wooden furniture," "installing neutral-toned wall treatments," and "placing minimalist decor items." At least one facilitator model 144 may interface with at least one provider model 172 associated with provider data containing a portfolio showcasing expertise in Scandinavian design. In another non-limiting example, for a home design SCS emphasizing energy efficiency, however, plurality of action datums 160 may include "installation of solar panels," "integration of smart thermostats," and "use of energy-efficient appliances." At least one provider model 172 having provider data indicating a background in green building practices may be prioritized, by at least one facilitator model 144.

With continued reference to FIG. 1, in some cases, executing SCS 112 may include generating a home design quote 180 as a function of SCS 112 and plurality of action datums 160 through a quoting process at the at least one provider model 172. As described in this disclosure, a "home design quote" refers to a detailed estimation of costs, resources, and timeframes associated with the realization of a specific home design as outlined in SCS 112 and/or execution of plurality of action datums 160. In an embodiment, home design quote 180 may provide a comprehensive breakdown of all anticipated expenses, from material costs to labor charges, and may also include potential contingencies or additional services that may be required during execution of plurality of action datums 160 as described above. In a non-limiting example, home design quote may include, without limitation, itemized costs for each quantitative elements 128 calculated based on configuration parameters 132, labor charges for each action datum of plurality of action datums 160, fees for any required permits or licenses, potential overheads, and any discounts or promotions applicable at facilitator model 144 and or provider model 172. Additionally, or alternatively, home design quote may also provide a timeline for project completion including an expected start and end dates for each phase of the home design process as described herein.

Still referring to FIG. 1 a "quoting process," for the purpose of this disclosure, refers to a systematic procedure of assessing each compartment data file of plurality of compartment data files within the SCS 112, evaluating associated action datums 160, and then generating home design quote 180 as described above that captures all the pertinent details. In some cases, quoting process may include utilization of one or more machine learning models generated by machine learning module as described herein. In a non-limiting example, apparatus 100 may be configured to integrate with third-party platforms by utilizing one or more third-party application programming interfaces (APIs) at any processing steps as described in this disclosure. Once home design quote 180 is generated, processor 104 may be configured to sync with accounting software such as QUICKBOOKS, thereby allowing real-time tracking of expenses, automated invoicing, and efficient financial management throughout the home design process as described herein. For instance, and without limitation, as materials are procured or services are rendered during execution of plurality of action datums 160, associated costs may be instantly updated in linked third-party finance software e.g., QUICKBOOKS, ensuring that the financial records may be consistently up-to-date and accurate at any given point in time.

In a non-limiting example, and still referring to FIG. 1, home design quote 180 may include a final quantitative indicator, wherein the final quantitative indicator may be used to determine a pricing of all the elements within each compartment data file of plurality of compartment data files 116. In some cases, processor 104 may receive one or more algorithms, wherein the algorithms may be used to compute a price of a particular paint color, a price of one or more components and a price of one or more configuration parameters 132 as described above. In some cases, processor 104 may receive the algorithms from data store 136 wherein each set of algorithms may be associated to different users, facilitators, and/or providers. For example, and without limitation, a first manufacturer may contain their own pricing model whereas a second manufacturer may contain a differing pricing model. In some cases, quantitative elements 128 within each compartment data file of plurality of compartment data files 116 may be associated with one another wherein addition of a second configuration parameter 40 may affect the quantitative indicator of the first parameter. Similarly, selection of a second configuration parameter may affect temporal element of first configuration parameter. For example, and without limitation, selection of second configuration parameter may modify the pricing associated with first configuration parameter and the overall time frame needed for manufacture.

With continued reference to FIG. 1, executing SCS 112 may further include establishing a real-time communication between at least one facilitator model 144 and at least one provider model 172 and update at least one facilitator model 144 as a function of execution of SCS 112 based on initiation of plurality of action datums 160 through the real-time communication. In some cases, real-time communication may ensure that all involved models e.g., user model 124, facilitator model 144, and provider model 172 remain synchronized and informed throughout execution of plurality of action datums 160. Such real-time communication may be established through various communication protocol as described in this disclosure, such as, without limitation, using WebSockets protocol. In some cases, execution of SCS 112 and/or execution of plurality of action datums 160 may be serialized using formats such as, without limitation, JSON, protocol buffers, or any other lightweight data formats, ensuring minimal latency in data transmission. Additionally, or alternatively, apparatus 100 may implement event-driven architecture, wherein specific events e.g., initiation of one or more action datums may trigger specific response or updates. In some cases, update to at least one facilitator model 144 may allow facilitator model to relay specific requirements, preferences, and modifications pertaining to SCS 112 directly to at least one provider model 172. Initiating plurality of action datums 160 may include continuously update at least one facilitator model 144 regarding the progress, challenges, or any other relevant feedback of action datum. In a non-limiting example, during the execution of a particular action datum, at least one provider model 172 may identify a resource constraint. Provider model may instantly communicate the resource constraint to at least one facilitator model 144 in communication with user model 124. Facilitator model may, in turn, make one or more necessary adjustments, e.g., whether it's sourcing an alternative material, rescheduling a specific task, or reallocating resources. Further various tools, features, and/or third-party APIs, including, without limitation, video conferencing, file sharing, instant messaging (via chatbot 156) may be incorporated to facilitate real-time communication between models, further enhance its efficiency.

With continued reference to FIG. 1, apparatus may include a graphical user interface (GUI). In some cases, processor 104 may be configured to modify graphical user interface as a function of special configuration schema 112, compartment data files 116, facilitator model 144, provider model 172 and/or any other data described in this disclosure by a populating user interface data structure and visually presenting the data through modification of the graphical user interface. A user interface may include graphical user interface, command line interface (CLI), menu-driven user interface, touch user interface, voice user interface (VUI), form-based user interface, any combination thereof and the like. In some embodiments, a user may interact with the user interface using a computing device distinct from and communicatively connected to processor. For example, a smart phone, smart tablet, or laptop operated by the user and/or participant. A user interface may include one or more graphical locator and/or cursor facilities allowing a user to interact with graphical models and/or combinations thereof, for instance using a touchscreen, touchpad, mouse, keyboard, and/or other manual data entry device. A "graphical user interface," as used herein, is a user interface that allows users to interact with electronic devices through visual representations. In some embodiments, GUI may include icons, menus, other visual indicators, or representations (graphics), audio indicators such as primary notation, and display information and related user controls. A menu may contain a list of choices and may allow users to select one from them. A menu bar may be displayed horizontally across the screen such as pull-down menu. When any option is clicked in this menu, then the pull-down menu may appear. A menu may include a context menu that appears only when the user performs a specific action. An example of this is pressing the right mouse button. When this is done, a menu may appear under the cursor. Files, programs, web pages and the like may be represented using a small picture in graphical user interface. In one or more embodiments, GUI may visualize functionalities offered by apparatus 100 wherein, selection of data may be visualized as a push button, transmittal and/or receipt of communications may be visualized on a single window, and the like, Persons skilled in the art, upon reviewing the entirety of this disclosure, will be aware of various ways in which a graphical user interface and/or elements thereof may be implemented and/or used as described in this disclosure.

With continued reference to FIG. 1, GUI may be located on a cloud network, a server, on a website and the like. In one or more embodiments, Apparatus 100 may include a GUI wherein apparatus 100 may communicate with a cloud network, data server, data store and the like to receive information in order visualize the information through GUI. In one or more embodiments, apparatus 100 may include a unique identifier associated with each user of apparatus 100 wherein the unique identifiers may be used to associate particular users with particular sets of data on received and/or generated by apparatus 100. For example, and without limitation, a first unique identifier may be used to associate a provider with a particular provider model 172. In another non limiting example, a unique identifier may be used to associate an end user with a particular SCS 112. In one or more embodiments, any data as described above may be stored on a database such as data store, wherein data may be retrieved upon receipt of a particular unique identifier. For example, and without limitation, an end user inputting a particular unique identifier may receive data associated with the end user. In one or more embodiments, unique identifiers may include a username and password wherein retrieval of information may only be accessed by the individual containing the correct username and password. In one or more embodiments, presentation of the GUI may differ for each user wherein, for example, an end user may view a first GUI and a provider may view a second and differing GUI. In one or more embodiments, Differing GUIs may allow for visualization of data based on the needs of each user. For example, and without limitation, an end user may require a GUI that is specific to receipt of SCS 112, user model 124 and the like, whereas a provider may require a GUI that is specific to received action datums 160 and/or their associated provider model 172. In one or more embodiments, GUI may differ based on whether the user is an end user, a facilitator and/or provider. In one or more embodiments, in an initial interaction with apparatus 100, apparatus may be configured to receive information associated with a user and categorize the user to a particular category, such as but not limited to, end users, facilitators, providers and the like. In one or more embodiments, the categorization may determine the particular layout and/or functionalities of the GUI. In one or more embodiments, users of apparatus 100 may include individuals such as individuals seeking to provide a spatial configuration schema, facilitators, providers, and the like. In one or more embodiments, apparatus 100 may allow for a single system in which data may be input, generated, and received by multiple differing users. In one or more embodiments, apparatus may include communication features wherein communication features may allow users to communicate with one another. These communication features may include text-based messaging, VoIP calls, video calls and the like. In one or more embodiments, functionalities may differ for each user, wherein a facilitator and/or provider may contain functionalities that allow the facility and/or provider to view multiple SCS 112, multiple actions datums 160 and the like whereas GUI may contain functionalities that allow the end user to interact and view data with their particular SCS 112. In one or more embodiments, functionalities associated with facilitators and/or providers may include recently made calls, associated SCS 112, associated action datums 160, payments made, payments received, previous work history and the like. In one or more embodiments, each GUI may be tailored to each specific user wherein each user may only visualize data associated with their profile.

With continued reference to FIG. 1, apparatus 100 may further include a display device communicatively connected to at least a processor 104. "Display device" for the purposes of this disclosure is a device configured to show visual information. In some cases, display device may include a liquid crystal display (LCD), a cathode ray tube (CRT), a plasma display, a light emitting diode (LED) display, and any combinations thereof. Display device may include, but is not limited to, a smartphone, tablet, laptop, monitor, tablet, and the like. Display device may include a separate device that includes a transparent screen configured to display computer generated images and/or information. In some cases, display device may be configured to visually present one or more data through GUI to a user, wherein a user may interact with the data through GUI. In some cases, a user may view GUI through display.

Figure 2:
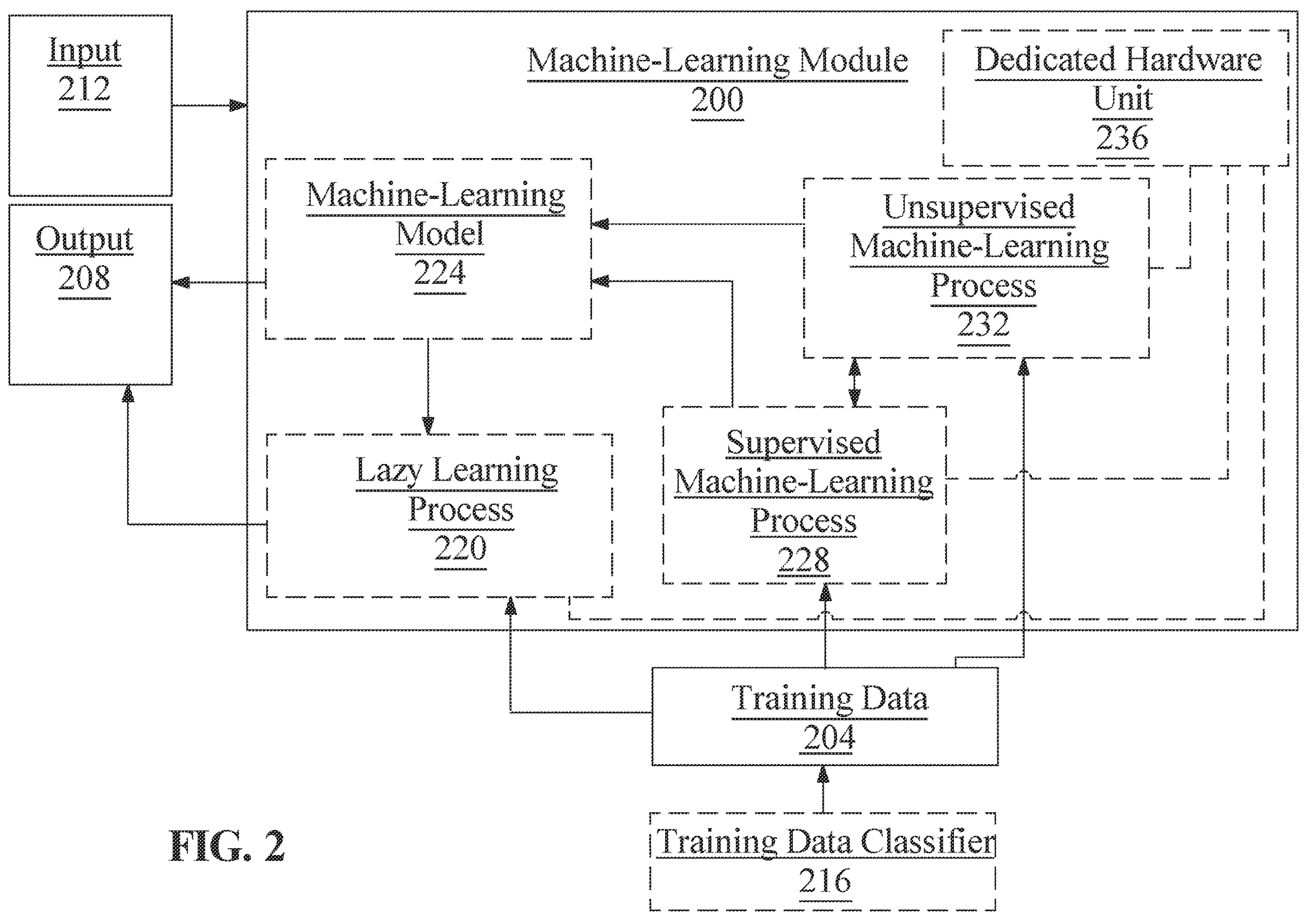
FIG. 2 is a block diagram of an exemplary embodiment of a machine learning module.

Referring now to FIG. 2, an exemplary embodiment of a machine-learning module 200 that may perform one or more machine-learning processes as described in this disclosure is illustrated. Machine-learning module may perform determinations, classification, and/or analysis steps, methods, processes, or the like as described in this disclosure using machine learning processes. A "machine learning process," as used in this disclosure, is a process that automatedly uses training data 204 to generate an algorithm instantiated in hardware or software logic, data structures, and/or functions that will be performed by a computing device/module to produce outputs 208 given data provided as inputs 212; this is in contrast to a non-machine learning software program where the commands to be executed are determined in advance by a user and written in a programming language.

Still referring to FIG. 2, "training data," as used herein, is data containing correlations that a machine-learning process may use to model relationships between two or more categories of data elements. For instance, and without limitation, training data 204 may include a plurality of data entries, also known as "training examples," each entry representing a set of data elements that were recorded, received, and/or generated together; data elements may be correlated by shared existence in a given data entry, by proximity in a given data entry, or the like. Multiple data entries in training data 204 may evince one or more trends in correlations between categories of data elements; for instance, and without limitation, a higher value of a first data element belonging to a first category of data element may tend to correlate to a higher value of a second data element belonging to a second category of data element, indicating a possible proportional or other mathematical relationship linking values belonging to the two categories. Multiple categories of data elements may be related in training data 204 according to various correlations; correlations may indicate causative and/or predictive links between categories of data elements, which may be modeled as relationships such as mathematical relationships by machine-learning processes as described in further detail below. Training data 204 may be formatted and/or organized by categories of data elements, for instance by associating data elements with one or more descriptors corresponding to categories of data elements. As a non-limiting example, training data 204 may include data entered in standardized forms by persons or processes, such that entry of a given data element in a given field in a form may be mapped to one or more descriptors of categories. Elements in training data 204 may be linked to descriptors of categories by tags, tokens, or other data elements; for instance, and without limitation, training data 204 may be provided in fixed-length formats, formats linking positions of data to categories such as comma-separated value (CSV) formats and/or self-describing formats such as extensible markup language (XML), JavaScript Object Notation (JSON), or the like, enabling processes or devices to detect categories of data.

Alternatively or additionally, and continuing to refer to FIG. 2, training data 204 may include one or more elements that are not categorized; that is, training data 204 may not be formatted or contain descriptors for some elements of data. Machine-learning algorithms and/or other processes may sort training data 204 according to one or more categorizations using, for instance, natural language processing algorithms, tokenization, detection of correlated values in raw data and the like; categories may be generated using correlation and/or other processing algorithms. As a non-limiting example, in a corpus of text, phrases making up a number "n" of compound words, such as nouns modified by other nouns, may be identified according to a statistically significant prevalence of n-grams containing such words in a particular order; such an n-gram may be categorized as an element of language such as a "word" to be tracked similarly to single words, generating a new category as a result of statistical analysis. Similarly, in a data entry including some textual data, a person's name may be identified by reference to a list, dictionary, or other compendium of terms, permitting ad-hoc categorization by machine-learning algorithms, and/or automated association of data in the data entry with descriptors or into a given format. The ability to categorize data entries automatedly may enable the same training data 204 to be made applicable for two or more distinct machine-learning algorithms as described in further detail below. Training data 204 used by machine-learning module 200 may correlate any input data as described in this disclosure to any output data as described in this disclosure. As a non-limiting illustrative example, training data may include a plurality of action datum sets as input correlated to a plurality of provider models as output.

Further referring to FIG. 2, training data may be filtered, sorted, and/or selected using one or more supervised and/or unsupervised machine-learning processes and/or models as described in further detail below; such models may include without limitation a training data classifier 216. Training data classifier 216 may include a "classifier," which as used in this disclosure is a machine-learning model as defined below, such as a data structure representing and/or using a mathematical model, neural net, or program generated by a machine learning algorithm known as a "classification algorithm," as described in further detail below, that sorts inputs into categories or bins of data, outputting the categories or bins of data and/or labels associated therewith. A classifier may be configured to output at least a datum that labels or otherwise identifies a set of data that are clustered together, found to be close under a distance metric as described below, or the like. A distance metric may include any norm, such as, without limitation, a Pythagorean norm. Machine-learning module 200 may generate a classifier using a classification algorithm, defined as a processes whereby a computing device and/or any module and/or component operating thereon derives a classifier from training data 204. Classification may be performed using, without limitation, linear classifiers such as without limitation logistic regression and/or naive Bayes classifiers, nearest neighbor classifiers such as k-nearest neighbors classifiers, support vector machines, least squares support vector machines, fisher's linear discriminant, quadratic classifiers, decision trees, boosted trees, random forest classifiers, learning vector quantization, and/or neural network-based classifiers.

Still referring to FIG. 2, computing device 204 may be configured to generate a classifier using a Naïve Bayes classification algorithm. Naïve Bayes classification algorithm generates classifiers by assigning class labels to problem instances, represented as vectors of element values. Class labels are drawn from a finite set. Naïve Bayes classification algorithm may include generating a family of algorithms that assume that the value of a particular element is independent of the value of any other element, given a class variable. Naïve Bayes classification algorithm may be based on Bayes Theorem expressed as $P(A/B)=P(B/A)P(A)=P(B)$, where $P(A/B)$ is the probability of hypothesis A given data B also known as posterior probability; $P(B/A)$ is the probability of data B given that the hypothesis A was true; $P(A)$ is the probability of hypothesis A being true regardless of data also known as prior probability of A; and $P(B)$ is the probability of the data regardless of the hypothesis. A naïve Bayes algorithm may be generated by first transforming training data into a frequency table. Computing device 204 may then calculate a likelihood table by calculating probabilities of different data entries and classification labels. Computing device 204 may utilize a naïve Bayes equation to calculate a posterior probability for each class. A class containing the highest posterior probability is the outcome of prediction. Naïve Bayes classification algorithm may include a gaussian model that follows a normal distribution. Naïve Bayes classification algorithm may include a multinomial model that is used for discrete counts. Naïve Bayes classification algorithm may include a Bernoulli model that may be utilized when vectors are binary.

With continued reference to FIG. 2, computing device 204 may be configured to generate a classifier using a K-nearest neighbors (KNN) algorithm. A "K-nearest neighbors algorithm" as used in this disclosure, includes a classification method that utilizes feature similarity to analyze how closely out-of-sample-features resemble training data to classify input data to one or more clusters and/or categories of features as represented in training data; this may be performed by representing both training data and input data in vector forms, and using one or more measures of vector similarity to identify classifications within training data, and to determine a classification of input data. K-nearest neighbors algorithm may include specifying a K-value, or a number directing the classifier to select the k most similar entries training data to a given sample, determining the most common classifier of the entries in the database, and classifying the known sample; this may be performed recursively and/or iteratively to generate a classifier that may be used to classify input data as further samples. For instance, an initial set of samples may be performed to cover an initial heuristic and/or "first guess" at an output and/or relationship, which may be seeded, without limitation, using expert input received according to any process as described herein. As a non-limiting example, an initial heuristic may include a ranking of associations between inputs and elements of training data. Heuristic may include selecting some number of highest-ranking associations and/or training data elements.

With continued reference to FIG. 2, generating k-nearest neighbors' algorithm may generate a first vector output containing a data entry cluster, generating a second vector output containing an input data, and calculate the distance between the first vector output and the second vector output using any suitable norm such as cosine similarity, Euclidean distance measurement, or the like. Each vector output may be represented, without limitation, as an n-tuple of values, where n is at least two values. Each value of n-tuple of values may represent a measurement or other quantitative value associated with a given category of data, or attribute, examples of which are provided in further detail below; a vector may be represented, without limitation, in n-dimensional space using an axis per category of value represented in n-tuple of values, such that a vector has a geometric direction characterizing the relative quantities of attributes in the n-tuple as compared to each other. Two vectors may be considered equivalent where their directions, and/or the relative quantities of values within each vector as compared to each other, are the same; thus, as a non-limiting example, a vector represented as [5, 10, 15] may be treated as equivalent, for purposes of this disclosure, as a vector represented as [1, 2, 3]. Vectors may be more similar where their directions are more similar, and more different where their directions are more divergent; however, vector similarity may alternatively or additionally be determined using averages of similarities between like attributes, or any other measure of similarity suitable for any n-tuple of values, or aggregation of numerical similarity measures for the purposes of loss functions as described in further detail below. Any vectors as described herein may be scaled, such that each vector represents each attribute along an equivalent scale of values. Each vector may be "normalized," or divided by a "length" attribute, such as a length attribute/as derived using a Pythagorean norm:

$$l = \sqrt{\sum_{i=0}^{n} a_i^2},$$

where $a_i$ is attribute number i of the vector. Scaling and/or normalization may function to make vector comparison independent of absolute quantities of attributes, while preserving any dependency on similarity of attributes; this may, for instance, be advantageous where cases represented in training data are represented by different quantities of samples, which may result in proportionally equivalent vectors with divergent values.

With further reference to FIG. 2, training examples for use as training data may be selected from a population of potential examples according to cohorts relevant to an analytical problem to be solved, a classification task, or the like. Alternatively or additionally, training data may be selected to span a set of likely circumstances or inputs for a machine-learning model and/or process to encounter when deployed. For instance, and without limitation, for each category of input data to a machine-learning process or model that may exist in a range of values in a population of phenomena such as images, user data, process data, physical data, or the like, a computing device, processor, and/or machine-learning model may select training examples representing each possible value on such a range and/or a representative sample of values on such a range. Selection of a representative sample may include selection of training examples in proportions matching a statistically determined and/or predicted distribution of such values according to relative frequency, such that, for instance, values encountered more frequently in a population of data so analyzed are represented by more training examples than values that are encountered less frequently. Alternatively or additionally, a set of training examples may be compared to a collection of representative values in a database and/or presented to a user, so that a process can detect, automatically or through user input, one or more values that are not included in the set of training examples. Computing device, processor, and/or module may automatically generate a missing training example; this may be done by receiving and/or retrieving a missing input and/or output value and correlating the missing input and/or output value with a corresponding output and/or input value collocated in a data record with the retrieved value, provided by a user and/or other device, or the like.

Continuing to refer to FIG. 2, computer, processor, and/or module may be configured to preprocess training data. "Preprocessing" training data, as used in this disclosure, is transforming training data from raw form to a format that can be used for training a machine learning model. Preprocessing may include sanitizing, feature selection, feature scaling, data augmentation and the like.

Still referring to FIG. 2, computer, processor, and/or module may be configured to sanitize training data. "Sanitizing" training data, as used in this disclosure, is a process whereby training examples are removed that interfere with convergence of a machine-learning model and/or process to a useful result. For instance, and without limitation, a training example may include an input and/or output value that is an outlier from typically encountered values, such that a machine-learning algorithm using the training example will be adapted to an unlikely amount as an input and/or output; a value that is more than a threshold number of standard deviations away from an average, mean, or expected value, for instance, may be eliminated. Alternatively, or additionally, one or more training examples may be identified as having poor quality data, where "poor quality" is defined as having a signal to noise ratio below a threshold value. Sanitizing may include steps such as removing duplicative or otherwise redundant data, interpolating missing data, correcting data errors, standardizing data, identifying outliers, and the like. In a nonlimiting example, santization may include utilizing algorithms for identifying duplicate entries or spell-check algorithms.

As a non-limiting example, and with further reference to FIG. 2, images used to train an image classifier or other machine-learning model and/or process that takes images as inputs or generates images as outputs may be rejected if image quality is below a threshold value. For instance, and without limitation, computing device, processor, and/or module may perform blur detection, and eliminate one or more Blur detection may be performed, as a non-limiting example, by taking Fourier transform, or an approximation such as a Fast Fourier Transform (FFT) of the image and analyzing a distribution of low and high frequencies in the resulting frequency-domain depiction of the image; numbers of high-frequency values below a threshold level may indicate blurriness. As a further non-limiting example, detection of blurriness may be performed by convolving an image, a channel of an image, or the like with a Laplacian kernel; this may generate a numerical score reflecting a number of rapid changes in intensity shown in the image, such that a high score indicates clarity and a low score indicates blurriness. Blurriness detection may be performed using a gradient-based operator, which measures operators based on the gradient or first derivative of an image, based on the hypothesis that rapid changes indicate sharp edges in the image, and thus are indicative of a lower degree of blurriness. Blur detection may be performed using Wavelet-based operator, which takes advantage of the capability of coefficients of the discrete wavelet transform to describe the frequency and spatial content of images. Blur detection may be performed using statistics-based operators take advantage of several image statistics as texture descriptors in order to compute a focus level. Blur detection may be performed by using discrete cosine transform (DCT) coefficients in order to compute a focus level of an image from its frequency content.

Continuing to refer to FIG. 2, computing device, processor, and/or module may be configured to precondition one or more training examples. For instance, and without limitation, where a machine learning model and/or process has one or more inputs and/or outputs requiring, transmitting, or receiving a certain number of bits, samples, or other units of data, one or more training examples' elements to be used as or compared to inputs and/or outputs may be modified to have such a number of units of data. For instance, a computing device, processor, and/or module may convert a smaller number of units, such as in a low pixel count image, into a desired number of units, for instance by upsampling and interpolating. As a non-limiting example, a low pixel count image may have 100 pixels, however a desired number of pixels may be 128. Processor may interpolate the low pixel count image to convert the 100 pixels into 128 pixels. It should also be noted that one of ordinary skill in the art, upon reading this disclosure, would know the various methods to interpolate a smaller number of data units such as samples, pixels, bits, or the like to a desired number of such units. In some instances, a set of interpolation rules may be trained by sets of highly detailed inputs and/or outputs and corresponding inputs and/or outputs downsampled to smaller numbers of units, and a neural network or other machine learning model that is trained to predict interpolated pixel values using the training data. As a non-limiting example, a sample input and/or output, such as a sample picture, with sample-expanded data units (e.g., pixels added between the original pixels) may be input to a neural network or machine-learning model and output a pseudo replica sample-picture with dummy values assigned to pixels between the original pixels based on a set of interpolation rules. As a non-limiting example, in the context of an image classifier, a machine-learning model may have a set of interpolation rules trained by sets of highly detailed images and images that have been downsampled to smaller numbers of pixels, and a neural network or other machine learning model that is trained using those examples to predict interpolated pixel values in a facial picture context. As a result, an input with sample-expanded data units (the ones added between the original data units, with dummy values) may be run through a trained neural network and/or model, which may fill in values to replace the dummy values. Alternatively or additionally, processor, computing device, and/or module may utilize sample expander methods, a low-pass filter, or both. As used in this disclosure, a "low-pass filter" is a filter that passes signals with a frequency lower than a selected cutoff frequency and attenuates signals with frequencies higher than the cutoff frequency. The exact frequency response of the filter depends on the filter design. Computing device, processor, and/or module may use averaging, such as luma or chroma averaging in images, to fill in data units in between original data units.

In some embodiments, and with continued reference to FIG. 2, computing device, processor, and/or module may down-sample elements of a training example to a desired lower number of data elements. As a non-limiting example, a high pixel count image may have 256 pixels, however a desired number of pixels may be 128. Processor may down-sample the high pixel count image to convert the 256 pixels into 128 pixels. In some embodiments, processor may be configured to perform downsampling on data. Downsampling, also known as decimation, may include removing every Nth entry in a sequence of samples, all but every Nth entry, or the like, which is a process known as "compression," and may be performed, for instance by an N-sample compressor implemented using hardware or software. Anti-aliasing and/or anti-imaging filters, and/or low-pass filters, may be used to clean up side-effects of compression.

Further referring to FIG. 2, feature selection includes narrowing and/or filtering training data to exclude features and/or elements, or training data including such elements, that are not relevant to a purpose for which a trained machine-learning model and/or algorithm is being trained, and/or collection of features and/or elements, or training data including such elements, on the basis of relevance or utility for an intended task or purpose for a trained machine-learning model and/or algorithm is being trained. Feature selection may be implemented, without limitation, using any process described in this disclosure, including without limitation using training data classifiers, exclusion of outliers, or the like.

With continued reference to FIG. 2, feature scaling may include, without limitation, normalization of data entries, which may be accomplished by dividing numerical fields by norms thereof, for instance as performed for vector normalization. Feature scaling may include absolute maximum scaling, wherein each quantitative datum is divided by the maximum absolute value of all quantitative data of a set or subset of quantitative data. Feature scaling may include min-max scaling, in which each value X has a minimum value $X_{min}$ in a set or subset of values subtracted therefrom, with the result divided by the range of the values, give maximum value in the set or subset $X_{max}$:

$$X_{new} = \frac{X - X_{min}}{X_{max} - X_{min}}.$$

Feature scaling may include mean normalization, which involves use of a mean value of a set and/or subset of values, $X_{mean}$ with maximum and minimum values:

$$X_{new} = \frac{X - X_{mean}}{X_{max} - X_{min}}.$$

Feature scaling may include standardization, where a difference between X and $X_{mean}$ is divided by a standard deviation σ of a set or subset of values:

$$X_{new} = \frac{X - X_{mean}}{\sigma}.$$

Scaling may be performed using a median value of a set or subset $X_{median}$ and/or interquartile range (IQR), which represents the difference between the $25^{th}$ percentile value and the $50^{th}$ percentile value (or closest values thereto by a rounding protocol), such as:

$$X_{new} = \frac{X - X_{median}}{IQR}.$$

Persons skilled in the art, upon reviewing the entirety of this disclosure, will be aware of various alternative or additional approaches that may be used for feature scaling.

Further referring to FIG. 2, computing device, processor, and/or module may be configured to perform one or more processes of data augmentation. "Data augmentation" as used in this disclosure is addition of data to a training set using elements and/or entries already in the dataset. Data augmentation may be accomplished, without limitation, using interpolation, generation of modified copies of existing entries and/or examples, and/or one or more generative AI processes, for instance using deep neural networks and/or generative adversarial networks as described above; generative processes may be referred to alternatively in this context as "data synthesis" and as creating "synthetic data." Augmentation may include performing one or more transformations on data, such as geometric, color space, affine, brightness, cropping, and/or contrast transformations of images.

Still referring to FIG. 2, machine-learning module 200 may be configured to perform a lazy-learning process 220 and/or protocol, which may alternatively be referred to as a "lazy loading" or "call-when-needed" process and/or protocol, may be a process whereby machine learning is conducted upon receipt of an input to be converted to an output, by combining the input and training set to derive the algorithm to be used to produce the output on demand. For instance, an initial set of simulations may be performed to cover an initial heuristic and/or "first guess" at an output and/or relationship. As a non-limiting example, an initial heuristic may include a ranking of associations between inputs and elements of training data 204. Heuristic may include selecting some number of highest-ranking associations and/or training data 204 elements. Lazy learning may implement any suitable lazy learning algorithm, including without limitation a K-nearest neighbors algorithm, a lazy naïve Bayes algorithm, or the like; persons skilled in the art, upon reviewing the entirety of this disclosure, will be aware of various lazy-learning algorithms that may be applied to generate outputs as described in this disclosure, including without limitation lazy learning applications of machine-learning algorithms as described in further detail below.

Alternatively or additionally, and with continued reference to FIG. 2, machine-learning processes as described in this disclosure may be used to generate machine-learning models 224. A "machine-learning model," as used in this disclosure, is a data structure representing and/or instantiating a mathematical and/or algorithmic representation of a relationship between inputs and outputs, as generated using any machine-learning process including without limitation any process as described above, and stored in memory; an input is submitted to a machine-learning model 224 once created, which generates an output based on the relationship that was derived. For instance, and without limitation, a linear regression model, generated using a linear regression algorithm, may compute a linear combination of input data using coefficients derived during machine-learning processes to calculate an output datum. As a further non-limiting example, a machine-learning model 224 may be generated by creating an artificial neural network, such as a convolutional neural network comprising an input layer of nodes, one or more intermediate layers, and an output layer of nodes. Connections between nodes may be created through the process of "training" the network, in which elements from a training data 204 set are applied to the input nodes, a suitable training algorithm (such as Levenberg-Marquardt, conjugate gradient, simulated annealing, or other algorithms) is then used to adjust the connections and weights between nodes in adjacent layers of the neural network to produce the desired values at the output nodes. This process is sometimes referred to as deep learning.

Still referring to FIG. 2, machine-learning algorithms may include at least a supervised machine-learning process 228. At least a supervised machine-learning process 228, as defined herein, include algorithms that receive a training set relating a number of inputs to a number of outputs, and seek to generate one or more data structures representing and/or instantiating one or more mathematical relations relating inputs to outputs, where each of the one or more mathematical relations is optimal according to some criterion specified to the algorithm using some scoring function. For instance, a supervised learning algorithm may include plurality of compartment data files as described above as inputs, correlated to a plurality of facilitator models as outputs, and a scoring function representing a desired form of relationship to be detected between inputs and outputs; scoring function may, for instance, seek to maximize the probability that a given input and/or combination of elements inputs is associated with a given output to minimize the probability that a given input is not associated with a given output. Scoring function may be expressed as a risk function representing an "expected loss" of an algorithm relating inputs to outputs, where loss is computed as an error function representing a degree to which a prediction generated by the relation is incorrect when compared to a given input-output pair provided in training data 204. Persons skilled in the art, upon reviewing the entirety of this disclosure, will be aware of various possible variations of at least a supervised machine-learning process 228 that may be used to determine relation between inputs and outputs. Supervised machine-learning processes may include classification algorithms as defined above.

With further reference to FIG. 2, training a supervised machine-learning process may include, without limitation, iteratively updating coefficients, biases, weights based on an error function, expected loss, and/or risk function. For instance, an output generated by a supervised machine-learning model using an input example in a training example may be compared to an output example from the training example; an error function may be generated based on the comparison, which may include any error function suitable for use with any machine-learning algorithm described in this disclosure, including a square of a difference between one or more sets of compared values or the like. Such an error function may be used in turn to update one or more weights, biases, coefficients, or other parameters of a machine-learning model through any suitable process including without limitation gradient descent processes, least-squares processes, and/or other processes described in this disclosure. This may be done iteratively and/or recursively to gradually tune such weights, biases, coefficients, or other parameters. Updating may be performed, in neural networks, using one or more back-propagation algorithms. Iterative and/or recursive updates to weights, biases, coefficients, or other parameters as described above may be performed until currently available training data is exhausted and/or until a convergence test is passed, where a "convergence test" is a test for a condition selected as indicating that a model and/or weights, biases, coefficients, or other parameters thereof has reached a degree of accuracy. A convergence test may, for instance, compare a difference between two or more successive errors or error function values, where differences below a threshold amount may be taken to indicate convergence. Alternatively, or additionally, one or more errors and/or error function values evaluated in training iterations may be compared to a threshold.

Still referring to FIG. 2, a computing device, processor, and/or module may be configured to perform method, method step, sequence of method steps and/or algorithm described in reference to this figure, in any order and with any degree of repetition. For instance, a computing device, processor, and/or module may be configured to perform a single step, sequence and/or algorithm repeatedly until a desired or commanded outcome is achieved; repetition of a step or a sequence of steps may be performed iteratively and/or recursively using outputs of previous repetitions as inputs to subsequent repetitions, aggregating inputs and/or outputs of repetitions to produce an aggregate result, reduction or decrement of one or more variables such as global variables, and/or division of a larger processing task into a set of iteratively addressed smaller processing tasks. A computing device, processor, and/or module may perform any step, sequence of steps, or algorithm in parallel, such as simultaneously and/or substantially simultaneously performing a step two or more times using two or more parallel threads, processor cores, or the like; division of tasks between parallel threads and/or processes may be performed according to any protocol suitable for division of tasks between iterations. Persons skilled in the art, upon reviewing the entirety of this disclosure, will be aware of various ways in which steps, sequences of steps, processing tasks, and/or data may be subdivided, shared, or otherwise dealt with using iteration, recursion, and/or parallel processing.

Further referring to FIG. 2, machine learning processes may include at least an unsupervised machine-learning processes 232. An unsupervised machine-learning process, as used herein, is a process that derives inferences in datasets without regard to labels; as a result, an unsupervised machine-learning process may be free to discover any structure, relationship, and/or correlation provided in the data. Unsupervised processes 232 may not require a response variable; unsupervised processes 232 may be used to find interesting patterns and/or inferences between variables, to determine a degree of correlation between two or more variables, or the like.

Still referring to FIG. 2, machine-learning module 200 may be designed and configured to create a machine-learning model 224 using techniques for development of linear regression models. Linear regression models may include ordinary least squares regression, which aims to minimize the square of the difference between predicted outcomes and actual outcomes according to an appropriate norm for measuring such a difference (e.g. a vector-space distance norm); coefficients of the resulting linear equation may be modified to improve minimization. Linear regression models may include ridge regression methods, where the function to be minimized includes the least-squares function plus term multiplying the square of each coefficient by a scalar amount to penalize large coefficients. Linear regression models may include least absolute shrinkage and selection operator (LASSO) models, in which ridge regression is combined with multiplying the least-squares term by a factor of 1 divided by double the number of samples. Linear regression models may include a multi-task lasso model wherein the norm applied in the least-squares term of the lasso model is the Frobenius norm amounting to the square root of the sum of squares of all terms. Linear regression models may include the elastic net model, a multi-task elastic net model, a least angle regression model, a LARS lasso model, an orthogonal matching pursuit model, a Bayesian regression model, a logistic regression model, a stochastic gradient descent model, a perceptron model, a passive aggressive algorithm, a robustness regression model, a Huber regression model, or any other suitable model that may occur to persons skilled in the art upon reviewing the entirety of this disclosure. Linear regression models may be generalized in an embodiment to polynomial regression models, whereby a polynomial equation (e.g. a quadratic, cubic or higher-order equation) providing a best predicted output/actual output fit is sought; similar methods to those described above may be applied to minimize error functions, as will be apparent to persons skilled in the art upon reviewing the entirety of this disclosure.

Continuing to refer to FIG. 2, machine-learning algorithms may include, without limitation, linear discriminant analysis. Machine-learning algorithm may include quadratic discriminant analysis. Machine-learning algorithms may include kernel ridge regression. Machine-learning algorithms may include support vector machines, including without limitation support vector classification-based regression processes. Machine-learning algorithms may include stochastic gradient descent algorithms, including classification and regression algorithms based on stochastic gradient descent. Machine-learning algorithms may include nearest neighbors algorithms. Machine-learning algorithms may include various forms of latent space regularization such as variational regularization. Machine-learning algorithms may include Gaussian processes such as Gaussian Process Regression. Machine-learning algorithms may include cross-decomposition algorithms, including partial least squares and/or canonical correlation analysis. Machine-learning algorithms may include naïve Bayes methods. Machine-learning algorithms may include algorithms based on decision trees, such as decision tree classification or regression algorithms. Machine-learning algorithms may include ensemble methods such as bagging meta-estimator, forest of randomized trees, AdaBoost, gradient tree boosting, and/or voting classifier methods. Machine-learning algorithms may include neural net algorithms, including convolutional neural net processes.

Still referring to FIG. 2, a machine-learning model and/or process may be deployed or instantiated by incorporation into a program, apparatus, system and/or module. For instance, and without limitation, a machine-learning model, neural network, and/or some or all parameters thereof may be stored and/or deployed in any memory or circuitry. Parameters such as coefficients, weights, and/or biases may be stored as circuit-based constants, such as arrays of wires and/or binary inputs and/or outputs set at logic "1" and "0" voltage levels in a logic circuit to represent a number according to any suitable encoding system including twos complement or the like or may be stored in any volatile and/or non-volatile memory. Similarly, mathematical operations and input and/or output of data to or from models, neural network layers, or the like may be instantiated in hardware circuitry and/or in the form of instructions in firmware, machine-code such as binary operation code instructions, assembly language, or any higher-order programming language. Any technology for hardware and/or software instantiation of memory, instructions, data structures, and/or algorithms may be used to instantiate a machine-learning process and/or model, including without limitation any combination of production and/or configuration of non-reconfigurable hardware elements, circuits, and/or modules such as without limitation ASICs, production and/or configuration of reconfigurable hardware elements, circuits, and/or modules such as without limitation FPGAs, production and/or of non-reconfigurable and/or configuration non-rewritable memory elements, circuits, and/or modules such as without limitation non-rewritable ROM, production and/or configuration of reconfigurable and/or rewritable memory elements, circuits, and/or modules such as without limitation rewritable ROM or other memory technology described in this disclosure, and/or production and/or configuration of any computing device and/or component thereof as described in this disclosure. Such deployed and/or instantiated machine-learning model and/or algorithm may receive inputs from any other process, module, and/or component described in this disclosure, and produce outputs to any other process, module, and/or component described in this disclosure.

Continuing to refer to FIG. 2, any process of training, retraining, deployment, and/or instantiation of any machine-learning model and/or algorithm may be performed and/or repeated after an initial deployment and/or instantiation to correct, refine, and/or improve the machine-learning model and/or algorithm. Such retraining, deployment, and/or instantiation may be performed as a periodic or regular process, such as retraining, deployment, and/or instantiation at regular elapsed time periods, after some measure of volume such as a number of bytes or other measures of data processed, a number of uses or performances of processes described in this disclosure, or the like, and/or according to a software, firmware, or other update schedule. Alternatively or additionally, retraining, deployment, and/or instantiation may be event-based, and may be triggered, without limitation, by user inputs indicating sub-optimal or otherwise problematic performance and/or by automated field testing and/or auditing processes, which may compare outputs of machine-learning models and/or algorithms, and/or errors and/or error functions thereof, to any thresholds, convergence tests, or the like, and/or may compare outputs of processes described herein to similar thresholds, convergence tests or the like. Event-based retraining, deployment, and/or instantiation may alternatively or additionally be triggered by receipt and/or generation of one or more new training examples; a number of new training examples may be compared to a preconfigured threshold, where exceeding the preconfigured threshold may trigger retraining, deployment, and/or instantiation.

Still referring to FIG. 2, retraining and/or additional training may be performed using any process for training described above, using any currently or previously deployed version of a machine-learning model and/or algorithm as a starting point. Training data for retraining may be collected, preconditioned, sorted, classified, sanitized or otherwise processed according to any process described in this disclosure. Training data may include, without limitation, training examples including inputs and correlated outputs used, received, and/or generated from any version of any system, module, machine-learning model or algorithm, apparatus, and/or method described in this disclosure; such examples may be modified and/or labeled according to user feedback or other processes to indicate desired results, and/or may have actual or measured results from a process being modeled and/or predicted by system, module, machine-learning model or algorithm, apparatus, and/or method as "desired" results to be compared to outputs for training processes as described above.

Redeployment may be performed using any reconfiguring and/or rewriting of reconfigurable and/or rewritable circuit and/or memory elements; alternatively, redeployment may be performed by production of new hardware and/or software components, circuits, instructions, or the like, which may be added to and/or may replace existing hardware and/or software components, circuits, instructions, or the like.

Further referring to FIG. 2, one or more processes or algorithms described above may be performed by at least a dedicated hardware unit 236. A "dedicated hardware unit," for the purposes of this figure, is a hardware component, circuit, or the like, aside from a principal control circuit and/or processor performing method steps as described in this disclosure, that is specifically designated or selected to perform one or more specific tasks and/or processes described in reference to this figure, such as without limitation preconditioning and/or sanitization of training data and/or training a machine-learning algorithm and/or model. A dedicated hardware unit 236 may include, without limitation, a hardware unit that can perform iterative or massed calculations, such as matrix-based calculations to update or tune parameters, weights, coefficients, and/or biases of machine-learning models and/or neural networks, efficiently using pipelining, parallel processing, or the like; such a hardware unit may be optimized for such processes by, for instance, including dedicated circuitry for matrix and/or signal processing operations that includes, e.g., multiple arithmetic and/or logical circuit units such as multipliers and/or adders that can act simultaneously and/or in parallel or the like. Such dedicated hardware units 236 may include, without limitation, graphical processing units (GPUs), dedicated signal processing modules, FPGA or other reconfigurable hardware that has been configured to instantiate parallel processing units for one or more specific tasks, or the like, A computing device, processor, apparatus, or module may be configured to instruct one or more dedicated hardware units 236 to perform one or more operations described herein, such as evaluation of model and/or algorithm outputs, one-time or iterative updates to parameters, coefficients, weights, and/or biases, and/or any other operations such as vector and/or matrix operations as described in this disclosure.

Figure 3:
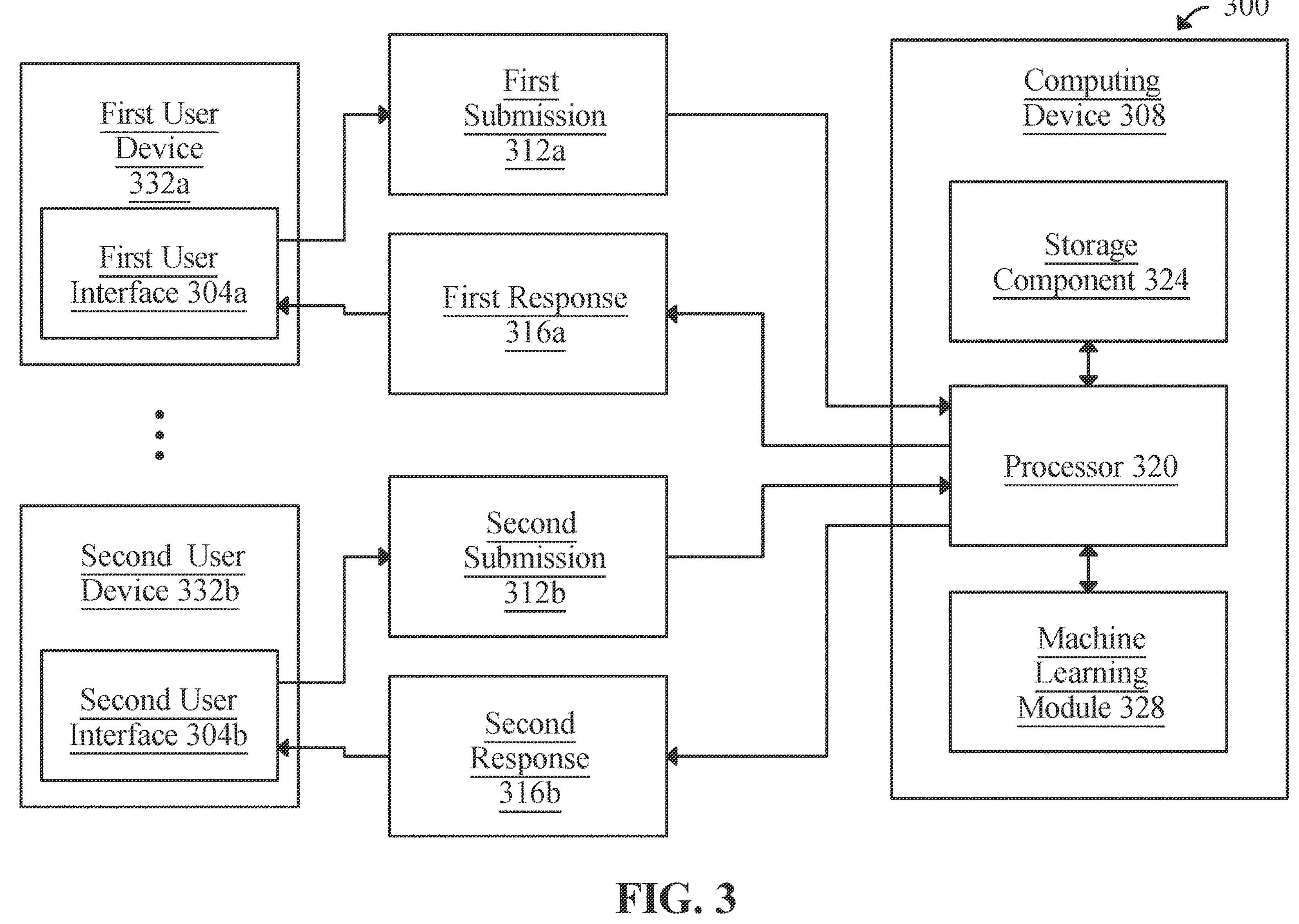
FIG. 3 is a block diagram of an exemplary embodiment of a chatbot.

Referring to FIG. 3, a chatbot system 300 is schematically illustrated. According to some embodiments, a user interface 304 may be communicative with a computing device 308 that is configured to operate a chatbot. In some cases, user interface 304 may be local to computing device 308. Alternatively, or additionally, in some cases, user interface 304 may remote to computing device 308 and communicative with the computing device 308, by way of one or more networks, such as without limitation the internet. Alternatively, or additionally, user interface 304 may communicate with user device 308 using telephonic devices and networks, such as without limitation fax machines, short message service (SMS), or multimedia message service (MMS). Commonly, user interface 304 communicates with computing device 308 using text-based communication, for example without limitation using a character encoding protocol, such as American Standard for Information Interchange (ASCII). Typically, a user interface 304 conversationally interfaces a chatbot, by way of at least a submission 312, from the user interface 308 to the chatbot, and a response 316, from the chatbot to the user interface 304. In many cases, one or both submission 312 and response 316 are text-based communication. Alternatively, or additionally, in some cases, one or both of submission 312 and response 316 are audio-based communication.

Continuing in reference to FIG. 3, a submission 312 once received by computing device 308 operating a chatbot, may be processed by a processor. In some embodiments, processor processes submission 312 using one or more keyword recognition, pattern matching, and natural language processing. In some embodiments, processor employs real-time learning with evolutionary algorithms. In some cases, processor may retrieve a pre-prepared response from at least a storage component 320, based upon submission 312. Alternatively, or additionally, in some embodiments, processor communicates a response 316 without first receiving a submission 312, thereby initiating conversation. In some cases, processor communicates an inquiry to user interface 304; and the processor is configured to process an answer to the inquiry in a following submission 312 from the user interface 304. In some cases, an answer to an inquiry presents within a submission 312 from a user device 304 may be used by computing device 308 as an input to another function.

Now referring to FIG. 3, in some embodiments, apparatus 100 may communicate with user and/or instructor using a chatbot. According to some embodiments, one or more user interfaces including first user interface 304*a* and second user interface 304*b* on one or more user devices including first user device 332*a* and second user device 332*b* may be communicative with a computing device 308 that is configured to operate a chatbot. In some embodiments, one or more user devices may be communicative in this way, such as 1, 2, 3, 4, 5, 6, 7, 8, 9, 10, 20, 30, 40, 50, 60, 70, 80, 90, 100, or more user devices. In some embodiments, first user interface 304*a* may be local to first user device 332*a*. In some embodiments, additional user interfaces such as second user interface 304*b* may be local to their respective user devices. In some embodiments, first user interface 304*a* may be local to computing device 308. In some embodiments, additional user interfaces such as second user interface 304*b* may be local to computing device 308. Alternatively or additionally, in some cases, first user interface 304*a* may remote to first user device 332*a* and communicative with first user device 332*a*, by way of one or more networks, such as without limitation the internet. Alternatively or additionally, one or more user interfaces may communicate with computing device 308 using telephonic devices and networks, such as without limitation fax machines, short message service (SMS), or multimedia message service (MMS). Commonly, user interfaces such as first user interface 304*a* communicate with computing device 308 using text-based communication, for example without limitation using a character encoding protocol, such as American Standard for Information Interchange (ASCII). Typically, user interfaces conversationally interface with a chatbot, by way of at least a submission, from a user interface to the chatbot, and a response, from the chatbot to the user interface. For example, first user interface 304*a* may interface with a chatbot using first submission 312*a* and first response 316*a*. In another example, second user interface 304*b* may interface with a chatbot using second submission 312*b* and second response 316*b*. In some embodiments, submissions such as first submission 312*a* and/or responses such as first response 316*a* may use text-based communication. In some embodiments, submissions such as first submission 312*a* and/or responses such as first response 316*a* may use audio communication.

Still referring to FIG. 3, a submission such as first submission 312*a* once received by computing device 308 operating a chatbot, may be processed by a processor 320. In some embodiments, processor 320 processes a submission such as first submission 312*a* using one or more of keyword recognition, pattern matching, and natural language processing. In some embodiments, processor employs real-time learning with evolutionary algorithms. In some cases, processor 320 may retrieve a pre-prepared response from at least a storage component 324, based upon submission such as first submission 312*a*. Alternatively or additionally, in some embodiments, processor 320 communicates a response such as first response 316*a* without first receiving a submission, thereby initiating conversation. In some cases, processor 320 communicates an inquiry to a user interface such as first user interface 304*a*; and processor 320 is configured to process an answer to the inquiry in a following submission from the user interface. In some cases, an answer to an inquiry present within a submission from a user device may be used by computing device 308 as an input to another function. In some embodiments, computing device 308 may include machine learning module 328. Machine learning module 328 may include any machine learning models described herein. In some embodiments, a submission such as first submission 312*a* may be input into a trained machine learning model within machine learning module 328. In some embodiments, a submission such as first submission 312*a* may undergo one or more processing steps before being input into a machine learning model. In some embodiments, a submission such as first submission 312*a* may be used to train a machine learning model within machine learning module 328.

Figure 4:
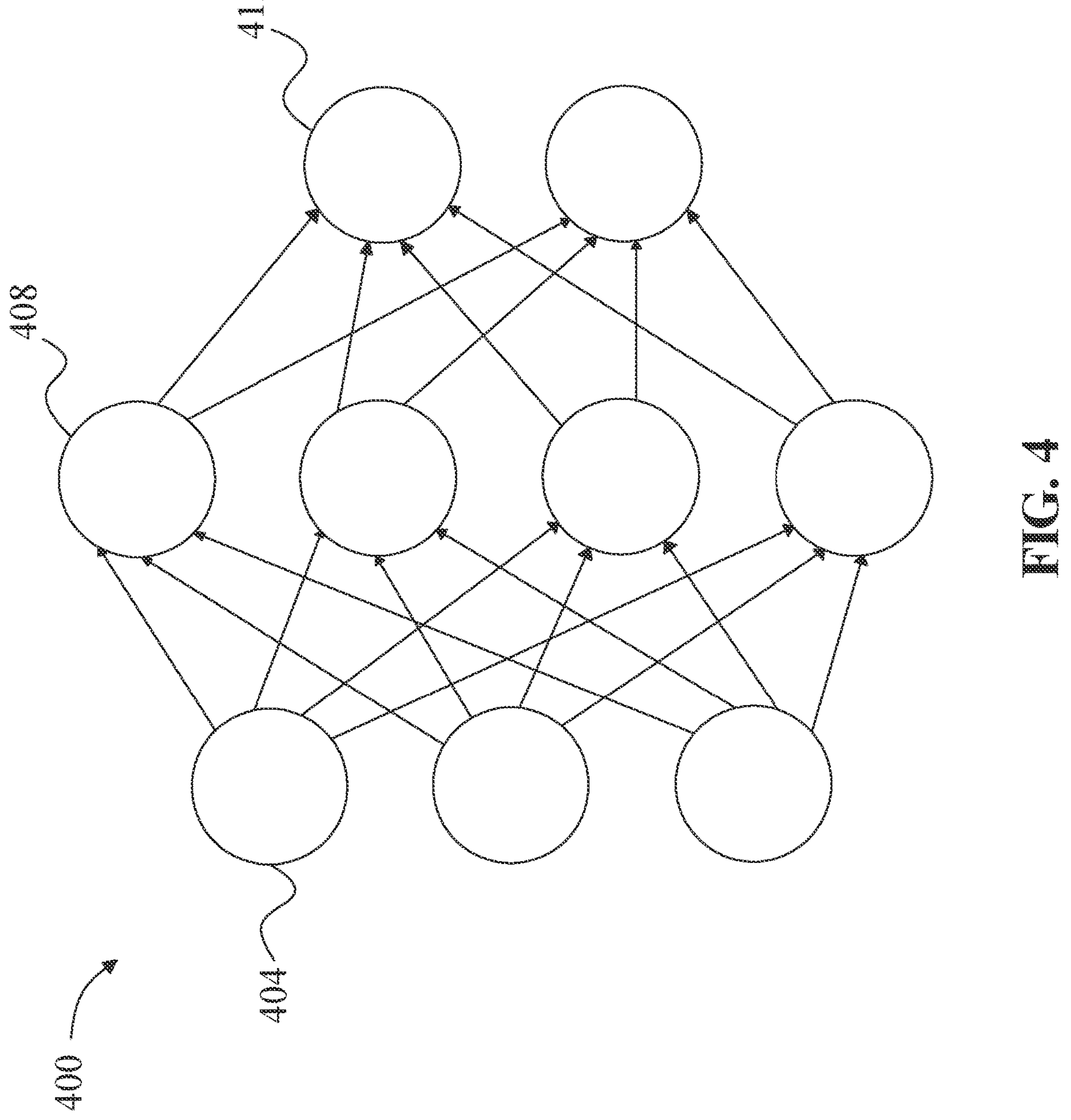
FIG. 4 is a diagram of an exemplary embodiment of a neural network.

Referring now to FIG. 4, an exemplary embodiment of neural network 400 is illustrated. A neural network 400 also known as an artificial neural network, is a network of "nodes," or data structures having one or more inputs, one or more outputs, and a function determining outputs based on inputs. Such nodes may be organized in a network, such as without limitation a convolutional neural network, including an input layer of nodes 404, one or more intermediate layers 408, and an output layer of nodes 412. In a non-limiting embodiment, input layer of nodes 404 may include any remote display where user inputs may be provided from, while output layer of nodes 412 may include either the local device if it has the processing capability to support the requisite machine-learning processes, or output layer of nodes 412 may refer to a centralized, network connected processor able to remotely conduct the machine-learning processes described herein. Connections between nodes may be created through the process of "training" the network, in which elements from a training dataset are applied to the input nodes, a suitable training algorithm (such as Levenberg-Marquardt, conjugate gradient, simulated annealing, or other algorithms) is then used to adjust the connections and weights between nodes in adjacent layers of the neural network to produce the desired values at the output nodes. Connections may run solely from input nodes toward output nodes in a "feed-forward" network or may feed outputs of one layer back to inputs of the same or a different layer in a "recurrent network." As a further non-limiting example, a neural network may include a convolutional neural network comprising an input layer of nodes, one or more intermediate layers, and an output layer of nodes. A "convolutional neural network," as used in this disclosure, is a neural network in which at least one hidden layer is a convolutional layer that convolves inputs to that layer with a subset of inputs known as a "kernel," along with one or more additional layers such as pooling layers, fully connected layers, and the like.

Figure 5:
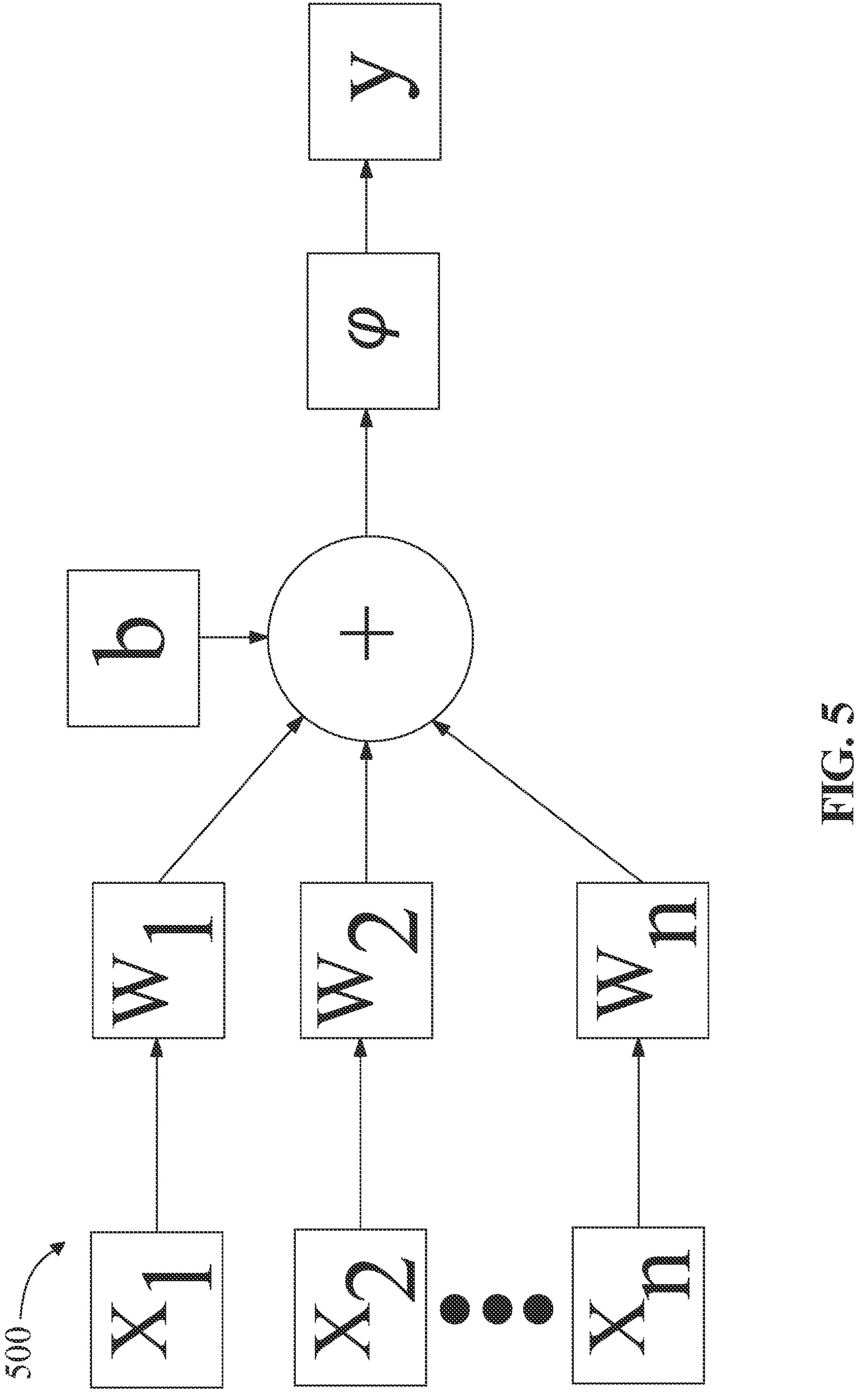
FIG. 5 is a block diagram of an exemplary embodiment of a node of a neural network.

Referring now to FIG. 5, an exemplary embodiment of a node 500 of a neural network is illustrated. A node may include, without limitation, a plurality of inputs $x_i$ that may receive numerical values from inputs to a neural network containing the node and/or from other nodes. Node may perform one or more activation functions to produce its output given one or more inputs, such as without limitation computing a binary step function comparing an input to a threshold value and outputting either a logic 1 or logic 0 output or something equivalent, a linear activation function whereby an output is directly proportional to the input, and/or a non-linear activation function, wherein the output is not proportional to the input. Non-linear activation functions may include, without limitation, a sigmoid function of the form $$f(x) = \frac{1}{1 - e^{-x}}$$

given input x, a tan h (hyperbolic tangent) function, of the form $$\frac{e^x - e^{-x}}{e^x 6 e^{-x}},$$

a tan h derivative function such as $f(x)=\tan h^2(x)$, a rectified linear unit function such as $f(x)=\max(0, x)$, a "leaky" and/or "parametric" rectified linear unit function such as $f(x)=\max(ax, x)$ for some a, an exponential linear units function such as $$f(x) = \begin{cases} x \text{ for } x \geq 0 \\ \alpha(e^x - 1) \text{ for } x < 0 \end{cases}$$

for some value of α (this function may be replaced and/or weighted by its own derivative in some embodiments), a softmax function such as $$f(x_i) = \frac{e^x}{\sum_i x_i}$$

where the inputs to an instant layer are $x_i$, a swish function such as $f(x)=x*\text{sigmoid}(x)$, a Gaussian error linear unit function such as $f(x)=a(16 \tan h(\sqrt{2/\pi}(x6bx^r)))$ for some values of a, b, and r, and/or a scaled exponential linear unit function such as $$f(x) = \lambda \begin{cases} \alpha(e^x - 1) \text{ for } x < 0 \\ x \text{ for } x \geq 0 \end{cases}.$$

Fundamentally, there is no limit to the nature of functions of inputs $x_i$ that may be used as activation functions. As a non-limiting and illustrative example, node may perform a weighted sum of inputs using weights $w_i$ that are multiplied by respective inputs $x_i$. Additionally, or alternatively, a bias b may be added to the weighted sum of the inputs such that an offset is added to each unit in the neural network layer that is independent of the input to the layer. The weighted sum may then be input into a function φ, which may generate one or more outputs y. Weight $w_i$ applied to an input $x_i$ may indicate whether the input is "excitatory," indicating that it has strong influence on the one or more outputs y, for instance by the corresponding weight having a large numerical value, and/or a "inhibitory," indicating it has a weak effect influence on the one more inputs y, for instance by the corresponding weight having a small numerical value. The values of weights $w_i$ may be determined by training a neural network using training data, which may be performed using any suitable process as described above.

Figure 6:
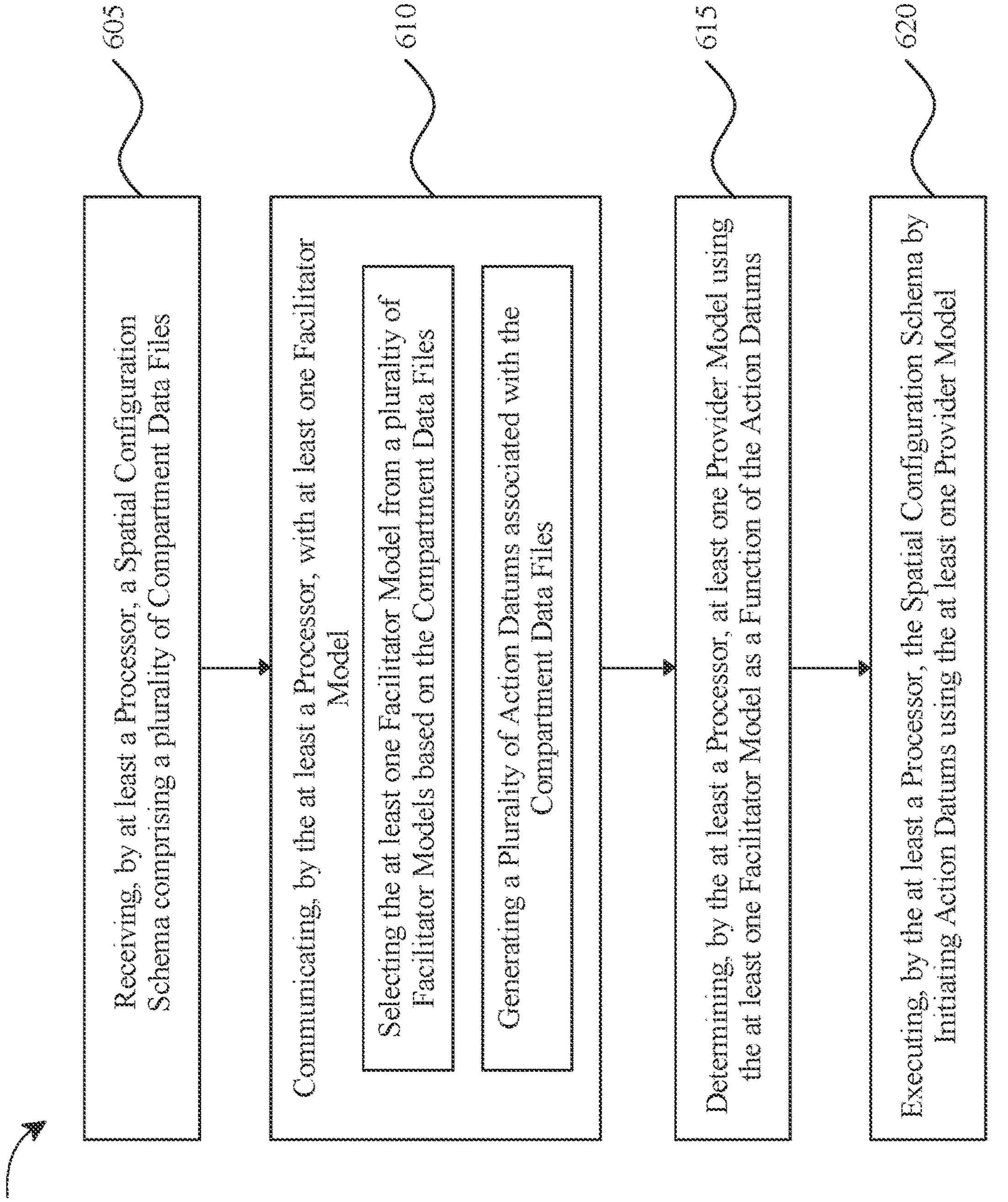
FIG. 6 is a flow diagram illustrating an exemplary embodiment of a method for facilitating a multi-model home design.

Now referring to FIG. 6, a flow diagram of an exemplary method 600 for facilitating a multi-model home design is illustrated. Method 600 includes a step 605 of receiving, by at least a processor, a spatial configuration schema, wherein the spatial configuration schema includes a plurality of compartment data files. In some embodiments, the spatial configuration schema may include home design data associated with the plurality of compartment data files received from a user model. In some embodiments, home design data may include a quantitative element associated with a plurality of configuration parameters. This may be implemented, without limitation, as described above with reference to FIGS. 1-5.

With continued reference to FIG. 6, method 600 includes a step 610 of communicating, by the at least a processor, with at least one facilitator model, wherein communicating with the at least one facilitator model includes selecting the at least one facilitator model from a plurality of facilitator models based on the plurality of compartment data files and generating a plurality of action datums associated with the plurality of compartment data files at the at least one facilitator model. In some embodiments, communicating with the at least one facilitator model may include utilizing a facilitator coordination module having at least a chatbot. In some embodiments, selecting the at least one facilitator model may include training a facilitator selection model using facilitator selection training data, wherein the facilitator selection training data may include a plurality of compartment data files as input and a plurality of facilitator models as output, and selecting at least one facilitator model from the plurality facilitator model based on the plurality of compartment data files using the trained facilitator selection model. In other embodiments, generating the plurality of action datums may include prioritizing the plurality of action datums based on a temporal element associated with each action datum of the plurality of action datums. This may be implemented, without limitation, as described above with reference to FIGS. 1-5.

With continued reference to FIG. 6, method 600 includes a step 615 of determining, by the at least a processor, at least one provider model using the at least one facilitator model as a function of the plurality of action datums. In some embodiments, determining the at least one provider model may include scoring a plurality of provider models at the at least one facilitator model and selecting a highest scoring provider model. In other embodiments, determining the at least one provider model may include training a provider selection model using provider selection training data, wherein the provider training data may include a plurality of action datum sets as input correlated to a plurality of provider models as output, and determining the at least one provider model as a function of the plurality of action datums using the trained provider selection model. This may be implemented, without limitation, as described above with reference to FIGS. 1-5.

With continued reference to FIG. 6, method 600 includes a step 620 of executing, by the at least a processor, the spatial configuration schema by initiating the plurality of action datums using the at least one provider model. In some embodiments, executing the spatial configuration schema may include generating a home design quote as a function of the spatial configuration schema and the plurality of action datums through a quoting process at the at least one provider model. In some embodiments, executing the spatial configuration schema may include establishing a real-time communication between the at least one facilitator model and the at least one provider model and updating the at least one facilitator model as a function of the execution of the spatial configuration schema based on the initiation of the plurality of action datums through the real-time communication. This may be implemented, without limitation, as described above with reference to FIGS. 1-5.

It is to be noted that any one or more of the aspects and embodiments described herein may be conveniently implemented using one or more machines (e.g., one or more computing devices that are utilized as a user computing device for an electronic document, one or more server devices, such as a document server, etc.) programmed according to the teachings of the present specification, as will be apparent to those of ordinary skill in the computer art. Appropriate software coding can readily be prepared by skilled programmers based on the teachings of the present disclosure, as will be apparent to those of ordinary skill in the software art. Aspects and implementations discussed above employing software and/or software modules may also include appropriate hardware for assisting in the implementation of the machine executable instructions of the software and/or software module.

Such software may be a computer program product that employs a machine-readable storage medium. A machine-readable storage medium may be any medium that is capable of storing and/or encoding a sequence of instructions for execution by a machine (e.g., a computing device) and that causes the machine to perform any one of the methodologies and/or embodiments described herein. Examples of a machine-readable storage medium include, but are not limited to, a magnetic disk, an optical disc (e.g., CD, CD-R, DVD, DVD-R, etc.), a magneto-optical disk, a read-only memory "ROM" device, a random access memory "RAM" device, a magnetic card, an optical card, a solid-state memory device, an EPROM, an EEPROM, and any combinations thereof. A machine-readable medium, as used herein, is intended to include a single medium as well as a collection of physically separate media, such as, for example, a collection of compact discs or one or more hard disk drives in combination with a computer memory. As used herein, a machine-readable storage medium does not include transitory forms of signal transmission.

Such software may also include information (e.g., data) carried as a data signal on a data carrier, such as a carrier wave. For example, machine-executable information may be included as a data-carrying signal embodied in a data carrier in which the signal encodes a sequence of instruction, or portion thereof, for execution by a machine (e.g., a computing device) and any related information (e.g., data structures and data) that causes the machine to perform any one of the methodologies and/or embodiments described herein.

Examples of a computing device include, but are not limited to, an electronic book reading device, a computer workstation, a terminal computer, a server computer, a handheld device (e.g., a tablet computer, a smartphone, etc.), a web appliance, a network router, a network switch, a network bridge, any machine capable of executing a sequence of instructions that specify an action to be taken by that machine, and any combinations thereof. In one example, a computing device may include and/or be included in a kiosk.

Figure 7:
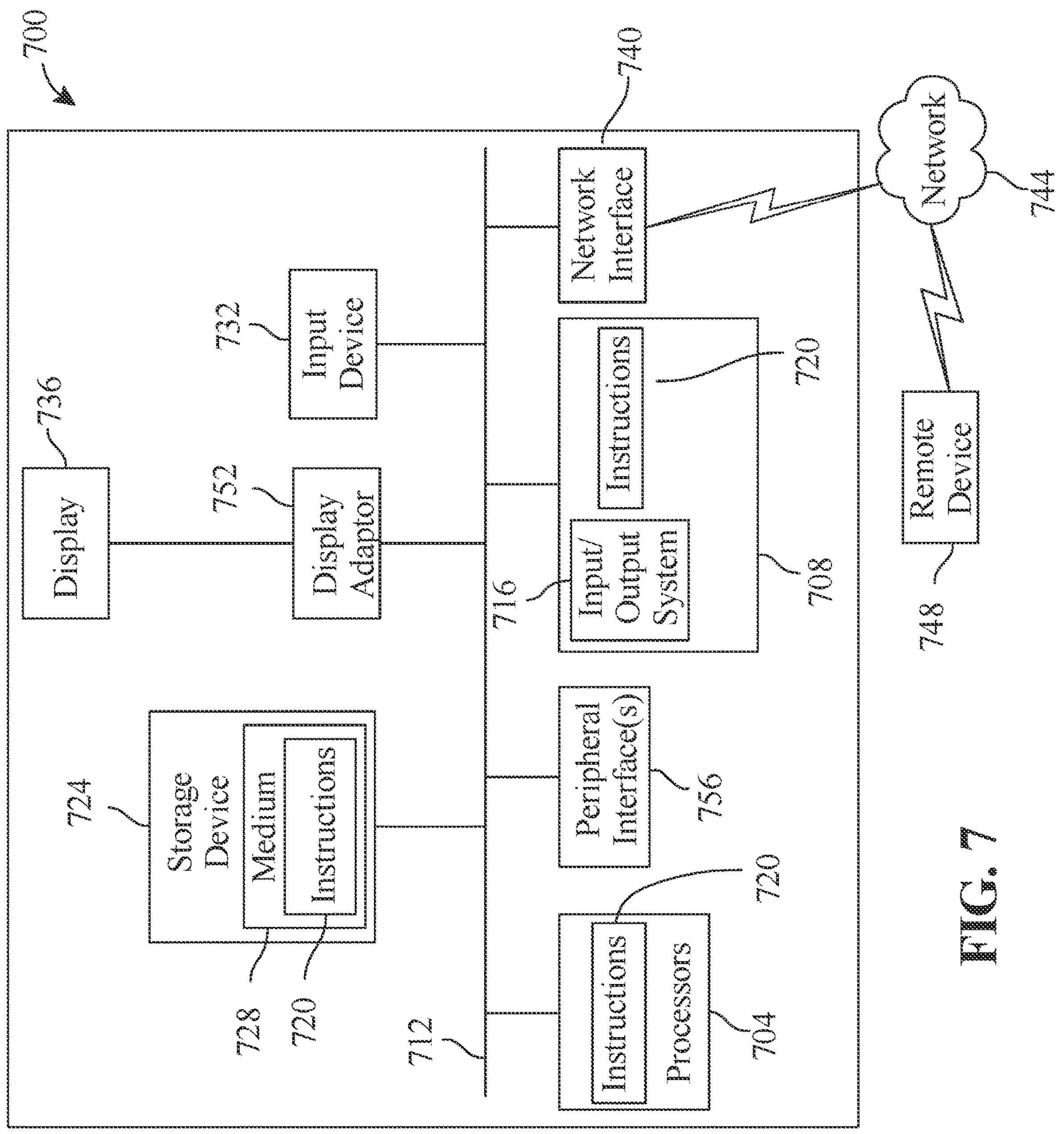
FIG. 7 is a block diagram of a computing system that can be used to implement any one or more of the methodologies disclosed herein and any one or more portions thereof.

FIG. 7 shows a diagrammatic representation of one embodiment of a computing device in the exemplary form of a computer system 700 within which a set of instructions for causing a control system to perform any one or more of the aspects and/or methodologies of the present disclosure may be executed. It is also contemplated that multiple computing devices may be utilized to implement a specially configured set of instructions for causing one or more of the devices to perform any one or more of the aspects and/or methodologies of the present disclosure. Computer system 700 includes a processor 704 and a memory 708 that communicate with each other, and with other components, through a bus 712. Bus 712 may include any of several types of bus structures including, but not limited to, a memory bus, a memory controller, a peripheral bus, a local bus, and any combinations thereof, using any of a variety of bus architectures.

Processor 704 may include any suitable processor, such as without limitation a processor incorporating logical circuitry for performing arithmetic and logical operations, such as an arithmetic and logic unit (ALU), which may be regulated with a state machine and directed by operational inputs from memory and/or sensors; processor 704 may be organized according to Von Neumann and/or Harvard architecture as a non-limiting example. Processor 704 may include, incorporate, and/or be incorporated in, without limitation, a microcontroller, microprocessor, digital signal processor (DSP), Field Programmable Gate Array (FPGA), Complex Programmable Logic Device (CPLD), Graphical Processing Unit (GPU), general purpose GPU, Tensor Processing Unit (TPU), analog or mixed signal processor, Trusted Platform Module (TPM), a floating point unit (FPU), and/or system on a chip (SoC).

Memory 708 may include various components (e.g., machine-readable media) including, but not limited to, a random-access memory component, a read only component, and any combinations thereof. In one example, a basic input/output system 716 (BIOS), including basic routines that help to transfer information between elements within computer system 700, such as during start-up, may be stored in memory 708. Memory 708 may also include (e.g., stored on one or more machine-readable media) instructions (e.g., software) 720 embodying any one or more of the aspects and/or methodologies of the present disclosure. In another example, memory 708 may further include any number of program modules including, but not limited to, an operating system, one or more application programs, other program modules, program data, and any combinations thereof.

Computer system 700 may also include a storage device 724. Examples of a storage device (e.g., storage device 724) include, but are not limited to, a hard disk drive, a magnetic disk drive, an optical disc drive in combination with an optical medium, a solid-state memory device, and any combinations thereof. Storage device 724 may be connected to bus 712 by an appropriate interface (not shown). Example interfaces include, but are not limited to, SCSI, advanced technology attachment (ATA), serial ATA, universal serial bus (USB), IEEE 1394 (FIREWIRE), and any combinations thereof. In one example, storage device 724 (or one or more components thereof) may be removably interfaced with computer system 700 (e.g., through an external port connector (not shown)). Particularly, storage device 724 and an associated machine-readable medium 728 may provide nonvolatile and/or volatile storage of machine-readable instructions, data structures, program modules, and/or other data for computer system 700. In one example, software 720 may reside, completely or partially, within machine-readable medium 728. In another example, software 720 may reside, completely or partially, within processor 704.

Computer system 700 may also include an input device 732. In one example, a user of computer system 700 may enter commands and/or other information into computer system 700 through input device 732. Examples of an input device 732 include, but are not limited to, an alpha-numeric input device (e.g., a keyboard), a pointing device, a joystick, a gamepad, an audio input device (e.g., a microphone, a voice response system, etc.), a cursor control device (e.g., a mouse), a touchpad, an optical scanner, a video capture device (e.g., a still camera, a video camera), a touchscreen, and any combinations thereof. Input device 732 may be interfaced to bus 712 through any of a variety of interfaces (not shown) including, but not limited to, a serial interface, a parallel interface, a game port, a USB interface, a FIREWIRE interface, a direct interface to bus 712, and any combinations thereof. Input device 732 may include a touch screen interface that may be a part of or separate from display 736, discussed further below. Input device 732 may be utilized as a user selection device for selecting one or more graphical representations in a graphical interface as described above.

A user may also input commands and/or other information to computer system 700 through storage device 724 (e.g., a removable disk drive, a flash drive, etc.) and/or network interface device 740. A network interface device, such as network interface device 740, may be utilized for connecting computer system 700 to one or more of a variety of networks, such as network 744, and one or more remote devices 748 connected thereto. Examples of a network interface device include, but are not limited to, a network interface card (e.g., a mobile network interface card, a LAN card), a modem, and any combination thereof. Examples of a network include, but are not limited to, a wide area network (e.g., the Internet, an enterprise network), a local area network (e.g., a network associated with an office, a building, a campus or other relatively small geographic space), a telephone network, a data network associated with a telephone/voice provider (e.g., a mobile communications provider data and/or voice network), a direct connection between two computing devices, and any combinations thereof. A network, such as network 744, may employ a wired and/or a wireless mode of communication. In general, any network topology may be used. Information (e.g., data, software 720, etc.) may be communicated to and/or from computer system 700 through network interface device 740.

Computer system 700 may further include a video display adapter 752 for communicating a displayable image to a display device, such as display device 736. Examples of a display device include, but are not limited to, a liquid crystal display (LCD), a cathode ray tube (CRT), a plasma display, a light emitting diode (LED) display, and any combinations thereof. Display adapter 752 and display device 736 may be utilized in combination with processor 704 to provide graphical representations of aspects of the present disclosure. In addition to a display device, computer system 700 may include one or more other peripheral output devices including, but not limited to, an audio speaker, a printer, and any combinations thereof. Such peripheral output devices may be connected to bus 712 through a peripheral interface 756. Examples of a peripheral interface include, but are not limited to, a serial port, a USB connection, a FIREWIRE connection, a parallel connection, and any combinations thereof.

The foregoing has been a detailed description of illustrative embodiments of the invention. Various modifications and additions can be made without departing from the spirit and scope of this invention. Features of each of the various embodiments described above may be combined with features of other described embodiments as appropriate in order to provide a multiplicity of feature combinations in associated new embodiments. Furthermore, while the foregoing describes a number of separate embodiments, what has been described herein is merely illustrative of the application of the principles of the present invention. Additionally, although particular methods herein may be illustrated and/or described as being performed in a specific order, the ordering is highly variable within ordinary skill to achieve methods, systems, and software according to the present disclosure. Accordingly, this description is meant to be taken only by way of example, and not to otherwise limit the scope of this invention.

Exemplary embodiments have been disclosed above and illustrated in the accompanying drawings. It will be understood by those skilled in the art that various changes, omissions and additions may be made to that which is specifically disclosed herein without departing from the spirit and scope of the present invention.

What is claimed is:

1. An apparatus for facilitating a multi-model home design, wherein the apparatus comprises:

at least a processor; and a memory communicatively connected to the at least a processor, wherein the memory contains instructions configuring the at least a processor to:

receive a spatial configuration schema, wherein the spatial configuration schema comprises a plurality of compartment data files received from a user model, wherein each compartment data file of the plurality of compartment data files further comprises at least a compartment configuration, wherein receiving further comprises receiving the at least a compartment configuration using a compartment configuration interface model;

communicate with at least one facilitator model, wherein communicating with the at least one facilitator model comprises:

utilizing a facilitator coordination module having at least a chatbot configured establish a real-time communication between the user model and the at least one facilitator model;

selecting the at least one facilitator model from a plurality of facilitator models based on the plurality of compartment data files; and generating a plurality of action datums associated with the plurality of compartment data files at the at least one facilitator model, wherein generating the plurality of action datums comprises employing an action datum generator comprising a generative adversarial network;

select at least one provider model, wherein the at least one provider model comprises at least one digital representation of a service provider, using the at least one facilitator model as a function of the plurality of action datums, wherein selecting the at least one provider model further comprises:

training a provider selection model using provider selection training data, wherein the provider training data comprises a plurality of action datum sets as input correlated to a plurality of provider models as output;

determining the at least one provider model as a function of the plurality of action datums using the trained provider selection model; and selecting the at least one provider model based on the determination; and execute the spatial configuration schema by initiating the plurality of action datums using the at least one provider model.

2. The apparatus of claim 1, wherein selecting the at least one facilitator model comprises:

training a facilitator selection model using facilitator selection training data, wherein the facilitator selection training data comprises a plurality of compartment data files as input and a plurality of facilitator models as output; and selecting at least one facilitator model from the plurality facilitator model based on the plurality of compartment data files using the trained facilitator selection model.

3. The apparatus of claim 1, wherein the action datum generator is trained using a plurality of pre-defined action datum templates.

4. The apparatus of claim 1, wherein generating the plurality of action datums comprises:

prioritizing the plurality of action datums based on a temporal element associated with each action datum of the plurality of action datums.

5. The apparatus of claim 1, wherein determining the at least one provider model comprises:

scoring a plurality of provider models using the at least one facilitator model; and selecting a highest scoring provider model.

6. The apparatus of claim 1, wherein executing the spatial configuration schema comprises:

generating a home design quote as a function of the spatial configuration schema and the plurality of action datums through a quoting process at the at least one provider model.

7. The apparatus of claim 1, wherein executing the spatial configuration schema comprises:

establishing a real-time communication between the at least one facilitator model and the at least one provider model; and updating the at least one facilitator model as a function of the execution of the spatial configuration schema based on the initiation of the plurality of action datums through the real-time communication.

8. A method for facilitating a multi-model home design, wherein the method comprises:

receiving, by at least a processor, a spatial configuration schema, wherein the spatial configuration schema comprises a plurality of compartment data files received from a user model, wherein each compartment data file of the plurality of compartment data files further comprises at least a compartment configuration, wherein receiving further comprises receiving the at least a compartment configuration using a compartment configuration interface model;

communicating, by the at least a processor, with at least one facilitator model, wherein communicating with the at least one facilitator model comprises:

utilizing a facilitator coordination module having at least a chatbot configured establish a real-time communication between the user model and the at least one facilitator model;

selecting the at least one facilitator model from a plurality of facilitator models based on the plurality of compartment data files; and generating a plurality of action datums associated with the plurality of compartment data files at the at least one facilitator model, wherein generating the plurality of action datums comprises employing an action datum generator comprising a generative adversarial network;

selecting, by the at least a processor, at least one provider model, wherein the at least one provider model comprises at least one digital representation of a service provider, using the at least one facilitator model as a function of the plurality of action datums, wherein selecting the at least one provider model further comprises:

training a provider selection model using provider selection training data, wherein the provider training data comprises a plurality of action datum sets as input correlated to a plurality of provider models as output;

determining the at least one provider model as a function of the plurality of action datums using the trained provider selection model; and selecting the at least one provider model based on the determination; and executing, by the at least a processor, the spatial configuration schema by initiating the plurality of action datums using the at least one provider model.

9. The method of claim 8, wherein selecting the at least one facilitator model comprises:

training a facilitator selection model using facilitator selection training data, wherein the facilitator selection training data comprises a plurality of compartment data files as input and a plurality of facilitator models as output; and selecting at least one facilitator model from the plurality facilitator model based on the plurality of compartment data files using the trained facilitator selection model.

10. The method of claim 8, wherein the action datum generator is trained using a plurality of pre-defined action datum templates.

11. The method of claim 8, wherein generating the plurality of action datums comprises:

prioritizing the plurality of action datums based on a temporal element associated with each action datum of the plurality of action datums.

12. The method of claim 8, wherein determining the at least one provider model comprises:

scoring a plurality of provider models using the at least one facilitator model; and selecting a highest scoring provider model.

13. The method of claim 8, wherein executing the spatial configuration schema comprises:

generating a home design quote as a function of the spatial configuration schema and the plurality of action datums through a quoting process at the at least one provider model.

14. The method of claim 8, wherein executing the spatial configuration schema comprises:

establishing a real-time communication between the at least one facilitator model and the at least one provider model; and updating the at least one facilitator model as a function of the execution of the spatial configuration schema based on the initiation of the plurality of action datums through the real-time communication.

* * * * *